(12) United States Patent  
Shibuya et al.

(10) Patent No.: US 7,923,361 B2  
(45) Date of Patent: Apr. 12, 2011

(54) METHOD FOR MANUFACTURING A SEMICONDUCTOR INTEGRATED CIRCUIT DEVICE

(75) Inventors: Katsuhisa Shibuya, Tokyo (JP); Hiromichi Waki, Tokyo (JP); Naoto Aida, Hitachinaka (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 127 days.

(21) Appl. No.: 12/474,529

(22) Filed: May 29, 2009

(65) Prior Publication Data

US 2009/0325368 A1    Dec. 31, 2009

(30) Foreign Application Priority Data

Jun. 27, 2008  (JP) ................................ 2008-168058

(51) Int. Cl.
*H01L 21/425* (2006.01)
(52) U.S. Cl. ................................ 438/530; 257/E21.311
(58) Field of Classification Search .................. 438/530, 438/709

See application file for complete search history.

(56) References Cited

U.S. PATENT DOCUMENTS

| 5,591,654 A * | 1/1997 | Kishimura ................. 438/526 |
| 6,800,512 B1 * | 10/2004 | Itonaga et al. ............. 438/154 |
| 2005/0199262 A1 | 9/2005 | Jeon et al. |

FOREIGN PATENT DOCUMENTS

| JP | 2001-044178 A | 2/2001 |
| JP | 2003-188151 A | 7/2003 |
| JP | 2005-523586 T | 8/2005 |
| JP | 2007-103509 A | 4/2007 |

* cited by examiner

*Primary Examiner* — Chandra Chaudhari
(74) *Attorney, Agent, or Firm* — Miles & Stockbridge P.C.

(57) ABSTRACT

The resist film after high-concentration ion implantation has a hard modified layer on the surface thereof, and is difficult to remove in the temperature region as low as about 150 degrees centigrade. This is because the etching rate of the modified layer sharply decreases with a decrease in temperature. The temperature is increased up to about 250 degrees centigrade to perform an ashing treatment in vacuum in order to increase the etching rate of the modified layer. Then, there occurs a popping phenomenon that the inside resist solvent swells and breaks. The residues scattered thereby of the modified layer and the like seize the wafer surface, and also become difficult to remove even in the subsequent cleaning. According to the present application, in order to remove the resist hardened by ion implantation and the like, the to-be-treated wafer is baked under atmospheric pressure, and then, is subjected to a plasma ashing treatment within the temperature region as high as around 300 degrees centigrade under an oxygen gas atmosphere substantially including an oxygen gas.

20 Claims, 26 Drawing Sheets

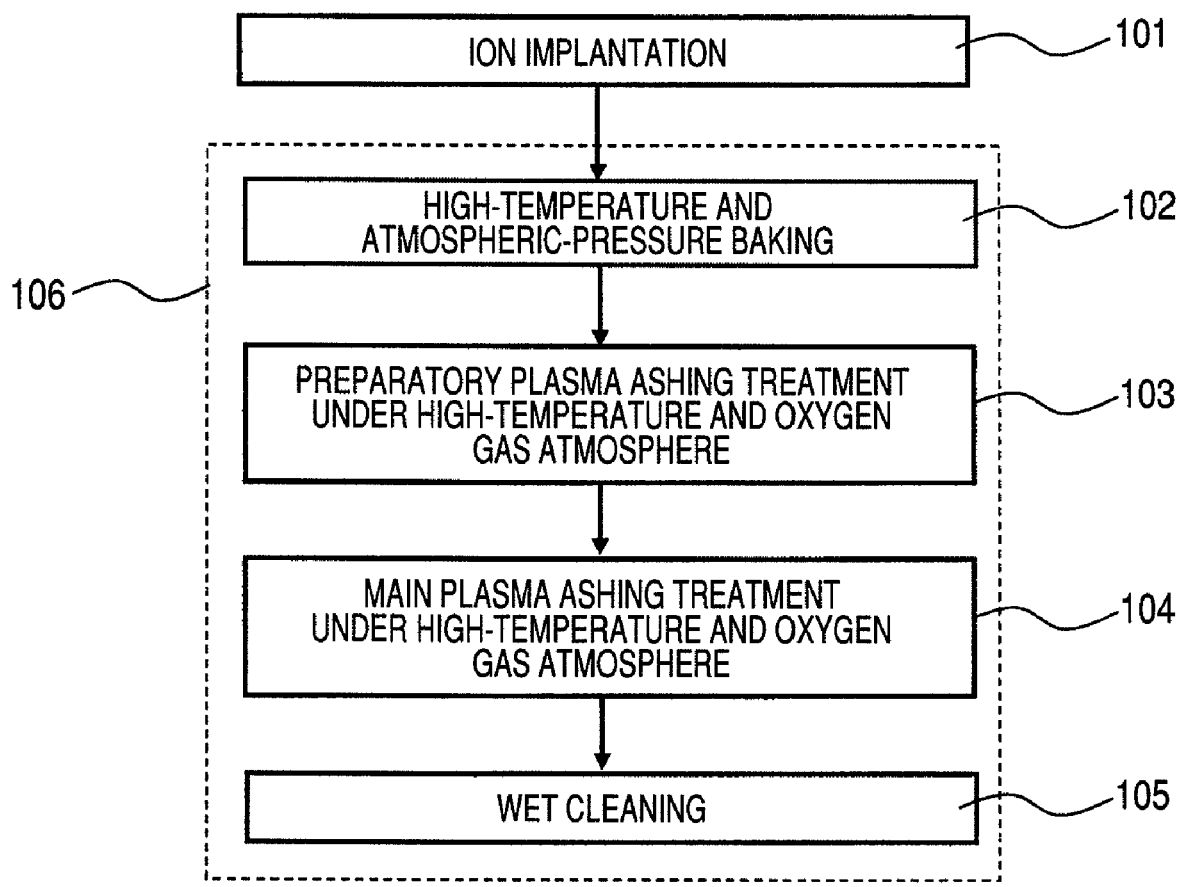

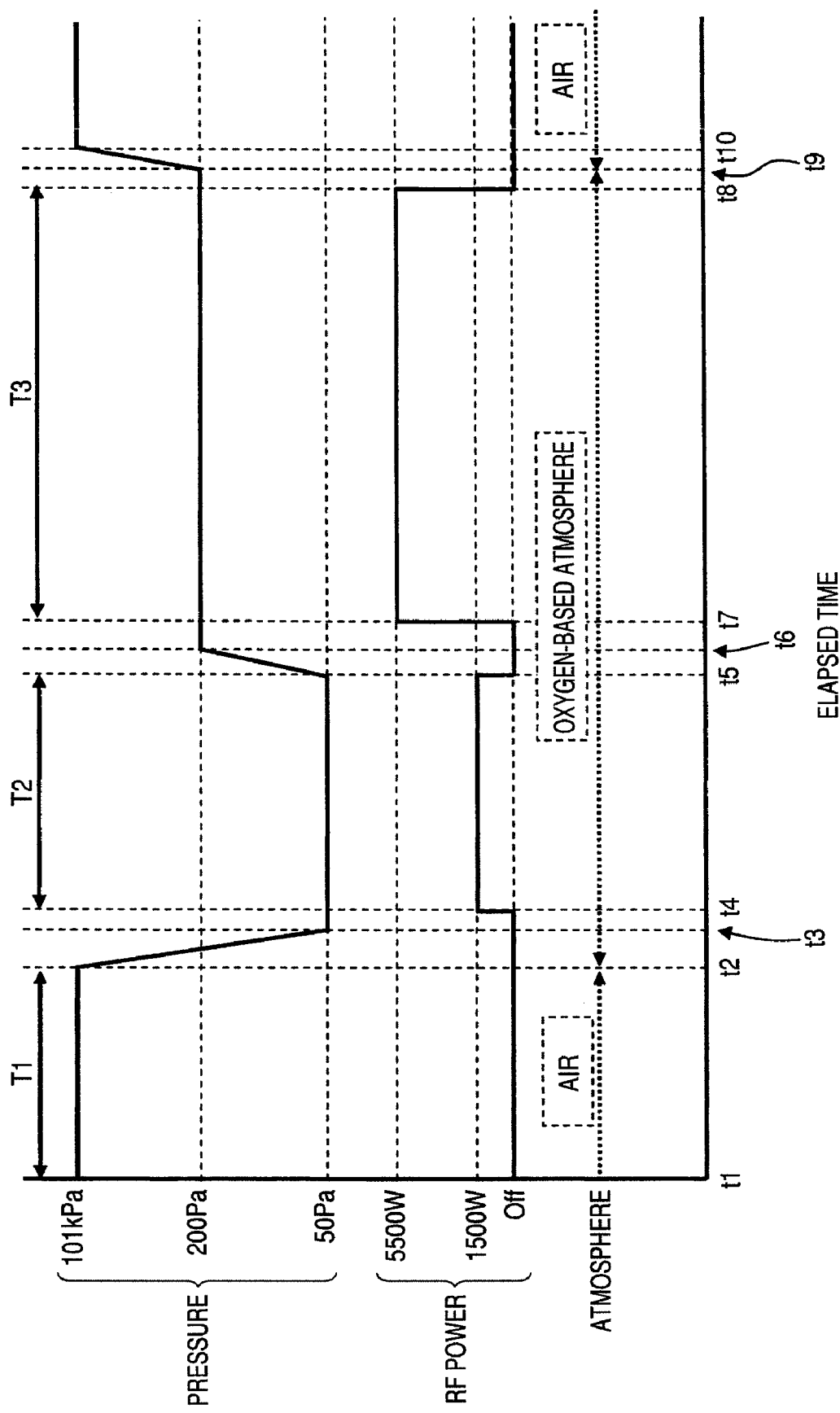

METHOD FOR MANUFACTURING A SEMICONDUCTOR INTEGRATED CIRCUIT DEVICE

CROSS-REFERENCE TO RELATED APPLICATIONS

The disclosure of Japanese Patent Application No. 2008-168058 filed on Jun. 27, 2008 including the specification, drawings and abstract is incorporated herein by reference in its entirety.

BACKGROUND OF THE INVENTION

The present invention relates to a technology effectively applicable to a resist removing technology in a method for manufacturing a semiconductor integrated circuit device (or a semiconductor device). More particularly, it relates to a technology effectively applicable to a technology of removing a resist after high-concentration ion implantation.

The published Japanese translation of a PCT patent application No. 2005-523586 (Patent Document 1) or its corresponding U.S. Pat. No. 2005-0199262 (Patent Document 2) discloses a technology of, in order to remove a resist hardened by etching or ion implantation, performing in situ baking on a hot plate at a relatively high temperature (250 degrees centigrade) under atmospheric pressure, and performing a plasma ashing treatment in a gas containing oxygen as a main component with hydrogen, nitrogen, and the like added therein (in vacuum) in the same furnace without change.

Japanese Unexamined Patent Publication No. 2007-103509 (Patent Document 3) discloses a technology of, for preventing popping in a step of removing a resist after ion implantation, performing two-stage plasma ashing (a first step mainly with oxygen ions, and a second step mainly with oxygen radicals) at relatively low temperatures (with a wafer temperature of about 150 degrees centigrade) in vacuum of an oxygen atmosphere.

Japanese Unexamined Patent Publication No. 2001-044178 (Patent Document 4) discloses a technology of, for preventing popping in a step of removing a resist after ion implantation, performing a low-temperature and high-temperature two-stage plasma ashing treatment in vacuum (nitrogen-added oxygen atmosphere).

Japanese Unexamined Patent Publication No. 2003-188151 (Patent Document 5) discloses a technology of, for preventing popping in a step of removing a resist after ion implantation, performing a plasma ashing treatment at a low temperature (at 120 degrees centigrade or less) in vacuum (ammonia atmosphere).

[Patent Document 1]
Published Japanese translation of PCT patent application No. 2005-523586
[Patent Document 2]
U.S. Pat. No. 2005-0199262
[Patent Document 3]
Japanese Unexamined Patent Publication No. 2007-103509
[Patent Document 4]
Japanese Unexamined Patent Publication No. 2001-044178
[Patent Document 5]
Japanese Unexamined Patent Publication No. 2003-188151

SUMMARY OF THE INVENTION

The resist film after high-concentration ion implantation has a hard modified layer on the surface thereof, and is difficult to remove in a low temperature region of about 150 degrees centigrade. This is because the etching rate of the modified layer sharply decreases with a decrease in temperature. The temperature is increased up to about 250 degrees centigrade to perform an ashing treatment in vacuum in order to increase the etching rate of the modified layer. Then, there occurs a popping phenomenon that the inside resist solvent swells and breaks. The residues of the modified layer and the like scattered thereby seize the wafer surface, and become difficult to remove even in the subsequent cleaning.

On the other hand, in recent years, there has been developed a remote plasma type ashing device capable of performing baking (in situ baking) under atmospheric pressure conditions in an ashing chamber, and performing an ashing treatment without change in order to allow a high-efficiency and high-temperature baking ashing continuous treatment. With such a device, it becomes possible to previously remove the solvent in the resist by atmospheric-pressure baking, and then, to perform a plasma ashing treatment at a temperature as relatively high as about 250 degrees centigrade and in vacuum under an oxygen atmosphere containing other additive gases such as a forming gas of hydrogen/nitrogen mixed gas or the like, an etching gas of $SF_6$ or the like, or a nitrogen gas, added thereto.

However, a study by the present inventors has revealed that there are the following problems. Namely, use of a hydrogen/nitrogen mixed gas results in deposition of reaction products on the surface of the wafer. As a result, etching residues occur upon etching of polysilicon. On the other hand, use of an etching gas such as $SF_6$ results in formation of sulfuric acid or the like, which increases the damages of the device. Further, with the aim of a sputtering action, a nitrogen gas, or other sputtering gases are added. Then, side effects such as scraping of the undercoat, and the like are intensified.

However, in order to avoid the side effects by these additive gases, without using an additive gas, a measure is taken only by elongation of the ashing treatment time within a low temperature region. Then, the treatment time largely exceeds the economic time range.

The present invention was made in order to solve the problems.

It is an object of the present invention to provide a manufacturing process of a high-reliability semiconductor integrated circuit device.

The foregoing and other objects, and novel features of the present invention will become apparent from the description in this specification, and the description to be made with reference to the accompanying drawings.

The outline of the typical aspect of the inventions disclosed in the present application will be simply described as follows.

Namely, according to the present invention, in order to remove a resist hardened by ion implantation or the like, a to-be-treated wafer is baked under atmospheric pressure. Then, under an oxygen gas atmosphere substantially including an oxygen gas, a plasma ashing treatment is performed at a temperature within a region as high as around 300 degrees centigrade.

The effects obtainable by the typical ones of the aspects of the invention disclosed in the present application will be briefly described as follows.

Namely, in order to remove a resist hardened by ion implantation or the like, a to-be-treated wafer is baked under atmospheric pressure. Then, under an oxygen gas atmosphere substantially including an oxygen gas, a plasma ashing treatment is performed at a temperature within a region as high as around 300 degrees centigrade. As a result, it is possible to provide a resist removal process which causes less damage to a device or a treating apparatus.

BRIEF DESCRIPTION OF THE DRAWINGS

FIG. 1 is a process block flowchart showing the flow of a resist removal process (high-temperature and oxygen gas ashing treatment) in a method for manufacturing a semiconductor device of one embodiment of the present application;

FIG. 2 is a process time chart showing the flow of a baking and ashing treatment in the resist removal process in the method for manufacturing a semiconductor device of one embodiment of the present application;

FIGS. 3A and 3B are charts, in which FIG. 3A is a process block flowchart and FIG. 3B is a process time chart of a modified example of a soft ashing treatment in the resist removal process in the method for manufacturing a semiconductor device of one embodiment of the present applications;

DESCRIPTION OF THE PREFERRED EMBODIMENTS

Outline of Embodiments

Figure 3A:
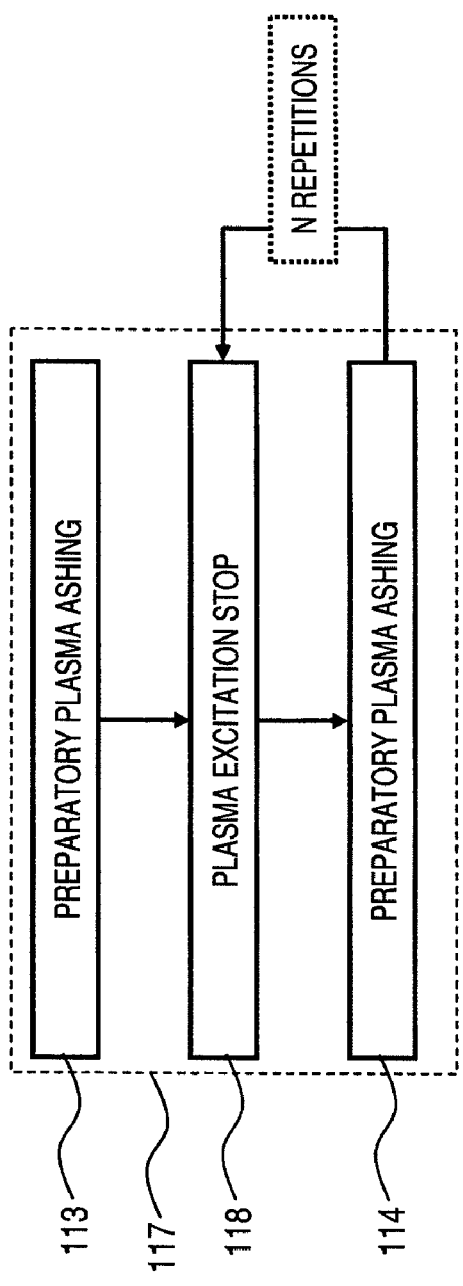

First, the outline of typical embodiments of the present invention disclosed in the present application will be described.

1. A method for manufacturing a semiconductor integrated circuit device, includes the steps of: (a) forming a resist film pattern over a first main surface of a wafer; (b) performing a high-concentration ion implantation treatment on the first main surface side of the wafer with the resist film pattern being present; (c) after the step (b), performing a baking treatment on the resist film pattern under atmospheric pressure, and within the wafer temperature range of 265 degrees centigrade or more and less than 350 degrees centigrade; (d) after the step (c), performing a first plasma ashing treatment on the first main surface of the wafer under an oxygen gas atmosphere, and within the wafer temperature range; (e) after the step (d), applying a higher RF power than that with the first plasma ashing treatment, and performing a second plasma ashing treatment on the first main surface of the wafer under an oxygen gas atmosphere and within the wafer temperature range.

2. In the method for manufacturing a semiconductor integrated circuit device according to the item 1, the lower limit of the wafer temperature range is 270 degrees centigrade.

3. In the method for manufacturing a semiconductor integrated circuit device according to the item 1, the lower limit of the wafer temperature range is 280 degrees centigrade.

4. In the method for manufacturing a semiconductor integrated circuit device according to any one of the items 1 to 3, the addition ratio of the oxygen gas atmosphere of the steps (d) and (e) is less than 2 vol %.

5. In the method for manufacturing a semiconductor integrated circuit device according to any one of the items 1 to 3, the addition ratio of the oxygen gas atmosphere of the steps (d) and (e) is less than 1 vol %.

6. In the method for manufacturing a semiconductor integrated circuit device according to any one of the items 1 to 5, the baking treatment and the first plasma ashing treatment are performed over the same wafer stage in the same treatment chamber.

7. In the method for manufacturing a semiconductor integrated circuit device according to any one of the items 1 to 6, the first plasma ashing treatment and the second plasma ashing treatment are performed over the same wafer stage in the same treatment chamber.

8. In the method for manufacturing a semiconductor integrated circuit device according to any one of the items 1 to 7, the steps (c) to (e) are performed over the same wafer stage in the same treatment chamber.

9. In the method for manufacturing a semiconductor integrated circuit device according to any one of the items 1 to 8, the steps (c) to (e) are performed over the same wafer stage set at a roughly constant temperature in the same treatment chamber.

10. The method for manufacturing a semiconductor integrated circuit device according to any one of the items 1 to 9, further includes a step of: (f) after the step (e), further performing a wet cleaning step on the first main surface of the wafer.

11. A method for manufacturing a semiconductor integrated circuit device, includes the steps of: (a) forming a resist film pattern over a first main surface of a wafer; (b) performing a high-concentration ion implantation treatment on the first main surface side of the wafer with the resist film pattern being present; (c) after the step (b), performing a first plasma ashing treatment on the first main surface of the wafer under an atmosphere containing an oxygen gas as a main component; (d) after the step (c), holding the wafer in a state such that there is substantially no plasma atmosphere in the vicinity of the first main surface of the wafer; (e) after the step (d), performing a second plasma ashing treatment on the first main surface of the wafer in an atmosphere containing an oxygen gas as a main component under roughly the same pressure as that in the step (c).

12. The method for manufacturing a semiconductor integrated circuit device according to the item 11, further includes a step of: (f) after the step (e), further performing the steps (d) and (e) only a prescribed number of repetition times.

13. The method for manufacturing a semiconductor integrated circuit device according to the item 11, further includes a step of: (g) after the step (e), applying a higher RF power than those with the first and second plasma ashing treatments, and performing a third plasma ashing treatment on the first main surface of the wafer under an atmosphere containing an oxygen gas as a main component, and within the wafer temperature range.

14. The method for manufacturing a semiconductor integrated circuit device according to the item 12, further includes a step of: (g) after the step (f), applying a higher RF power than those with the first and second plasma ashing treatments, and performing a third plasma ashing treatment on the first main surface of the wafer under an atmosphere containing an oxygen gas as a main component, and within the wafer temperature range.

15. The method for manufacturing a semiconductor integrated circuit device according to any one of the items 11 to 14, further includes a step of: (h) between the steps (b) and (c), performing a baking treatment on the resist film pattern under atmospheric pressure.

16. In the method for manufacturing a semiconductor integrated circuit device according to any one of the items 11 to 15, the steps (c) to (e) are performed over the same wafer stage in the same treatment chamber.

17. In the method for manufacturing a semiconductor integrated circuit device according to any one of the items 11 to 16, the steps (c) to (e) are performed without substantially changing the atmosphere.

18. In the method for manufacturing a semiconductor integrated circuit device according to any one of the items 11 to 17, the steps (c) to (e) are performed over the same wafer stage set at a roughly constant temperature in the same treatment chamber.

19. In the method for manufacturing a semiconductor integrated circuit device according to any one of the items 11 to 18, the steps (c) to (f) are performed over the same wafer stage in the same treatment chamber.

20. In the method for manufacturing a semiconductor integrated circuit device according to any one of the items 11 to 19, the steps (c) to (g) are performed over the same wafer stage in the same treatment chamber.

21. In the method for manufacturing a semiconductor integrated circuit device according to any one of the items 11 to 20, the steps (c) to (g), and (h) are performed over the same wafer stage in the same treatment chamber.

22. The method for manufacturing a semiconductor integrated circuit device according to any one of the items 13 to 21, further includes a step of: (i) after the step (g), performing a wet cleaning treatment on the first main surface of the wafer.

23. In the method for manufacturing a semiconductor integrated circuit device according to any one of the items 12 to 22, the prescribed repetition time is 0 or more and less than 10.

24. In the method for manufacturing a semiconductor integrated circuit device according to any one of the items 12 to 22, the prescribed repetition time is 1 or more and less than 10.

25. In the method for manufacturing a semiconductor integrated circuit device according to any one of the items 12 to 22, the prescribed repetition time is 2 or more and less than 10.

26. In the method for manufacturing a semiconductor integrated circuit device according to any one of the items 15 to 25, the baking treatment is performed within the wafer temperature range of 265 degrees centigrade or more and less than 350 degrees centigrade.

27. In the method for manufacturing a semiconductor integrated circuit device according to the item 26, the lower limit of the wafer temperature range is 270 degrees centigrade.

28. In the method for manufacturing a semiconductor integrated circuit device according to the item 26, the lower limit of the wafer temperature range is 280 degrees centigrade.

29. In the method for manufacturing a semiconductor integrated circuit device according to any one of the items 13 to 27, the first, second, and third plasma ashing treatment are performed within the wafer temperature range of 265 degrees centigrade or more and less than 350 degrees centigrade, and under an oxygen gas atmosphere.

30. In the method for manufacturing a semiconductor integrated circuit device according to any one of the items 1 to 29, the high-concentration ion implantation treatment is implantation of impurities to a polysilicon film to be a gate electrode.

31. In the method for manufacturing a semiconductor integrated circuit device according to any one of the items 1 to 30, the step (d) is performed in an atmosphere containing an oxygen gas as a main component under roughly the same pressure as that in the step (c).

32. A method for manufacturing a semiconductor integrated circuit device, includes the steps of: (a) forming a resist film pattern over a first main surface of a wafer; (b) performing a high-concentration ion implantation treatment on the first main surface side of the wafer with the resist film pattern being present; (c) after the step (b), performing a first plasma ashing treatment on the first main surface of the wafer under an atmosphere containing an oxygen gas as a main component; (d) after the step (c), holding the wafer in a state such that there is substantially no plasma atmosphere in the vicinity of the first main surface of the wafer; (e) after the step (d), performing a second plasma ashing treatment on the first main surface of the wafer in an atmosphere containing an oxygen gas as a main component; and (f) after the step (e), applying a higher RF power than those with the first and second plasma ashing treatments, and performing a third plasma ashing treatment on the first main surface of the wafer under an atmosphere containing an oxygen gas as a main component and within the wafer temperature range.

33. The method for manufacturing a semiconductor integrated circuit device according to the item 32, further includes a step of: (g) after the step (e) and before the step (f), further performing the steps (d) and (e) only a prescribed number of times.

34. The method for manufacturing a semiconductor integrated circuit device according to the item 32 or 33, further includes a step of: (h) between the steps (b) and (c), performing a baking treatment on the resist film pattern under atmospheric pressure.

35. In the method for manufacturing a semiconductor integrated circuit device according to any one of the items 32 to 34, the steps (c) to (e) are performed over the same wafer stage in the same treatment chamber.

36. In the method for manufacturing a semiconductor integrated circuit device according to any one of the items 32 to 35, the steps (c) to (e) are performed without substantially changing the atmosphere.

37. In the method for manufacturing a semiconductor integrated circuit device according to any one of the items 32 to 36, the steps (c) to (f) are performed over the same wafer stage set at a roughly constant temperature in the same treatment chamber.

38. In the method for manufacturing a semiconductor integrated circuit device according to any one of the items 32 to 37, the steps (c) to (f) are performed over the same wafer stage in the same treatment chamber.

39. In the method for manufacturing a semiconductor integrated circuit device according to any one of the items 32 to 38, the steps (c) to (g) are performed over the same wafer stage in the same treatment chamber.

40. In the method for manufacturing a semiconductor integrated circuit device according to any one of the items 34 to 39, the steps (c) to (h) are performed over the same wafer stage in the same treatment chamber.

41. The method for manufacturing a semiconductor integrated circuit device according to any one of the items 32 to 40, further includes a step of: (i) after the step (f), performing a wet cleaning treatment on the first main surface of the wafer.

42. In the method for manufacturing a semiconductor integrated circuit device according to any one of the items 33 to 41, the prescribed repetition time is 0 or more and less than 10.

43. In the method for manufacturing a semiconductor integrated circuit device according to any one of the items 33 to 41, the prescribed repetition time is 1 or more and less than 10.

44. In the method for manufacturing a semiconductor integrated circuit device according to any one of the items 33 to 41, the prescribed repetition time is 2 or more and less than 10.

45. In the method for manufacturing a semiconductor integrated circuit device according to any one of the items 34 to 44, the baking treatment is performed within the wafer temperature range of 265 degrees centigrade or more and less than 350 degrees centigrade.

46. In the method for manufacturing a semiconductor integrated circuit device according to the item 45, the lower limit of the wafer temperature range is 270 degrees centigrade.

47. In the method for manufacturing a semiconductor integrated circuit device according to the item 45, the lower limit of the wafer temperature range is 280 degrees centigrade.

48. In the method for manufacturing a semiconductor integrated circuit device according to any one of the items 32 to 47, the first, second, and third plasma ashing treatment are performed within the wafer temperature range of 265 degrees centigrade or more and less than 350 degrees centigrade, and under an oxygen gas atmosphere.

49. In the method for manufacturing a semiconductor integrated circuit device according to any one of the items 32 to 48, the high-concentration ion implantation treatment is implantation of impurities to a polysilicon film to be a gate electrode.

50. In the method for manufacturing a semiconductor integrated circuit device according to any one of the items 32 to 49, the step (d) is performed in an atmosphere containing an oxygen gas as a main component under roughly the same pressure as that in the step (c).

51. A method for manufacturing a semiconductor integrated circuit device, includes the steps of: (a) forming a resist film pattern over a first main surface of a wafer; (b) performing a high-concentration ion implantation treatment on the first main surface side of the wafer with the resist film pattern being present; (c) after the step (b), performing a baking treatment on the resist film pattern under atmospheric pressure, and within the wafer temperature range of 265 degrees centigrade or more and less than 350 degrees centigrade; and (d) after the step (c), performing a first plasma ashing treatment on the first main surface of the wafer under an oxygen gas atmosphere, and within the wafer temperature range.

52. In the method for manufacturing a semiconductor integrated circuit device according to the item 51, the lower limit of the wafer temperature range is 270 degrees centigrade.

53. In the method for manufacturing a semiconductor integrated circuit device according to the item 51, the lower limit of the wafer temperature range is 280 degrees centigrade.

54. In the method for manufacturing a semiconductor integrated circuit device according to any one of the items 51 to 53, the addition ratio of the oxygen gas atmosphere of the step (d) is less than 2 vol %.

55. In the method for manufacturing a semiconductor integrated circuit device according to any one of the items 51 to 53, the addition ratio of the oxygen gas atmosphere of the step (d) is less than 1 vol %.

56. In the method for manufacturing a semiconductor integrated circuit device according to any one of the items 51 to 55, the baking treatment and the first plasma ashing treatment are performed over the same wafer stage in the same treatment chamber.

57. In the method for manufacturing a semiconductor integrated circuit device according to any one of the items 51 to 56, the steps (c) to (d) are performed over the same wafer stage in the same treatment chamber.

58. In the method for manufacturing a semiconductor integrated circuit device according to any one of the items 51 to 57, the steps (c) to (d) are performed over the same wafer stage set at a roughly constant temperature in the same treatment chamber.

[Explanation of Description Form, Basic Terms, and Methods in the Present Application]

1. In the present application, for description of embodiments, the embodiment may be described in a plurality of divided sections for convenience. However, unless otherwise specified, these are not independent of each other, but are respective parts of a single example, or in a relation such that one is a partial detail of the other, or a modification example of a part or the whole of the other. Further, in principle, for the same parts, a description of the repetition is omitted. Whereas, each constitutional element in embodiments is not essential unless otherwise specified, and except when the number thereof is theoretically limited to the number, and except when the context clearly indicates otherwise.

2. Similarly, in the description of embodiments and the like, the wording "X including A" or the like used herein for the material, composition, or the like is not intended to exclude the one containing an element other than A as one of the main constitutional elements, unless otherwise specified, and unless the context clearly indicates otherwise. For example, the wording is intended to mean "X containing A as a main component", or the like for the component. For example, it is naturally understood that the term "silicon member" or the like herein used is intended to be not limited to pure silicon, but to also include a member including a SiGe alloy, or other multi metal alloys containing silicon as a main component, or other additives, or the like. Similarly, it is naturally understood that the term "silicon oxide film" is intended to include not only relatively pure undoped silicon dioxide films, but also thermal oxide films and CVD oxide films of FSG (fluorosilicate glass), TEOS-based silicon oxide, SiOC (silicon oxicarbide) or carbon-doped silicon oxide or OSG (organosilicate glass), PSG (phosphorus silicate glass), BPSG (Borophosphosilicate Glass), and the like, coating type silicon oxide films of SOG (spin on glass), NSC (nano-clustering silica), and the like, silica type low-k insulating films (porous type insulating films) obtained by introducing voids into the same members as these, composite films thereof with other silicon type insulating films containing these as main constituent elements, and the like.

3. Similarly, as for the drawings, positions, attributes, and the like, preferable examples thereof will be exemplified. However, the present invention is not strictly limited thereto, unless otherwise specified, and unless the context clearly indicates otherwise.

4. Further, also when specific numerical values and quantities are mentioned, unless otherwise specified, except when they are theoretically limited to the numbers, and unless the context clearly indicates otherwise, each numerical value may be a numerical value of more than the specific numerical value, or may be a numerical value of less than the specific numerical value.

5. The term "wafer" or "semiconductor wafer" generally denotes a single crystal silicon wafer, or the like, on which a semiconductor integrated circuit device (as well as a semiconductor device or an electronic device) is formed. However, it is naturally understood that the term also includes an epitaxial wafer, a SOI substrate, a composite wafer of an insulating substrate such as a LCD glass substrate and a semiconductor layer or the like.

6. The wording "substantially oxygen gas atmosphere" or "an atmosphere substantially including an oxygen gas" in the gas conditions for ashing of the present application denotes the composition (vol %) of gases other than oxygen based on the total amount, i.e., the addition ratio of less than 3%.

7. In the present application, the term "high-concentration ion implantation" or "Hi-DOSE" in ion implantation denotes the dose of $5 \times 10^{14}$ ions/cm$^2$ or more. When ions are implanted to the same portion plural times, the term denotes the total thereof.

8. The term "high temperature" in connection with an ashing treatment, a preceding baking treatment, or the like denotes a temperature of around 250 degrees centigrade, or higher. Whereas, the term "low temperature" in the similar case denotes the temperature such that the resist does not undergo popping (or the temperature equal to, or higher than the glass transition temperature), i.e., the temperature of around 110 to 120 degrees centigrade, or lower. Herein, the term "temperature" or "wafer temperature" denotes the temperature (setting temperature) of the wafer stage (hot plate). Further, the term "atmospheric pressure" in the similar case denotes atmospheric pressure, or the pressure within the range therearound. For example, under ordinary conditions, the atmospheric pressure is within the range of about 0.8 atmosphere to 1.2 atmospheres.

9. The term "plasma ashing treatment" in connection with the ashing treatment of the resist includes not only the treatment of exciting a plasma in a wafer treatment chamber as with a general in situ plasma method, but also the treatment using an ashing furnace of the following method: as with a remote plasma method described in the following examples, a plasma is excited outside the wafer treatment chamber, and the excited gas (including a neutral excited species) is transferred into the wafer treatment chamber.

Whereas, for the term "roughly the same pressure" in connection with the ashing treatment, for example, when 50 Pa is assumed to be the reference pressure, 25 Pa or 100 Pa is roughly the same pressure. However, 10 Pa or 200 Pa is generally not roughly the same pressure. On the other hand, when 1.0 pressure is assumed to be the reference pressure, 0.8 pressure or 1.2 pressures is roughly the same pressure. However, 0.5 pressure or 2.0 pressures is generally not roughly the same pressure. Incidentally, the treatment pressure depends upon the details of the conditions of the process, and the characteristics of the device. Therefore, it is needless to say that the applicable range of the specific treatment pressure exemplified in the following examples is not limited to roughly the same pressure.

10. The term "MISFET (metal insulator semiconductor field effect transistor)" indicates a wide concept including a MOSFET (metal oxide semiconductor field effect transistor) adaptable to the implementation of the Hi-k of the gate insulating film. The term "poly-silicon", "polysilicon gate", or "polysilicon film" (which is hereinafter referred to as "poly-silicon or the like") in connection with the gate electrode of MISFET is assumed to include not only so-called polysilicon but also amorphous silicon, microcrystal silicon, and an intermediate thereof. Further, even the term "polysilicon gate electrode", or the like is, in actuality, often a composite film of a lower layer polysilicon layer and an upper layer silicide layer (a polymetal gate additionally includes a layer containing a refractory metal such as tungsten as a main component). In the present application, the term "poly-silicon" or the like is used in a broad sense including them.

11. In description of the steps, for example, the wording "the steps (c) to (h)" means the steps in the alphabetical order. Namely, when the corresponding preceding description includes the steps (a), (b), (c), (d), (e), (f), and (h) (a step (g) is not included in the preceding description), the wording denotes "the steps (c), (d), (e), (f), and (h)".

[Details of Embodiments] Embodiments will be further described in details. In respective drawings, the same or similar parts are indicated with the same or similar signs or reference numerals. The description thereon is not repeated in principle.

1. Explanation of Device for Use in Each Ashing Treatment in a Method for Manufacturing a Semiconductor Integrated Circuit Device of One Embodiment of the Present Application (Mainly FIGS. 4 and 5)

Figure 4:
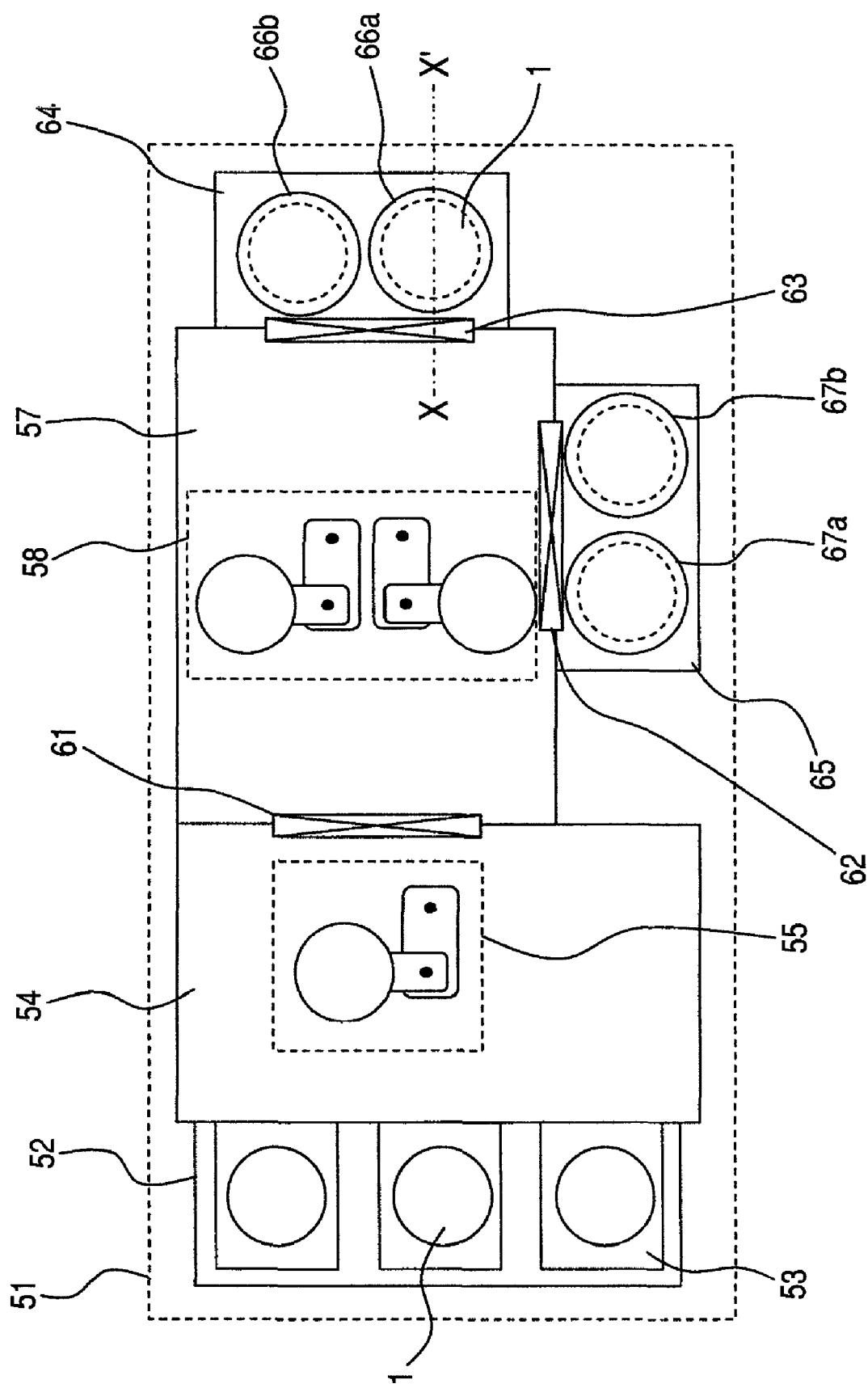
FIG. 4 is an overall planar structural view of a baking/ashing device for use in various resist removal processes in the method for manufacturing a semiconductor device of one embodiment of the present application.
Figure 5:
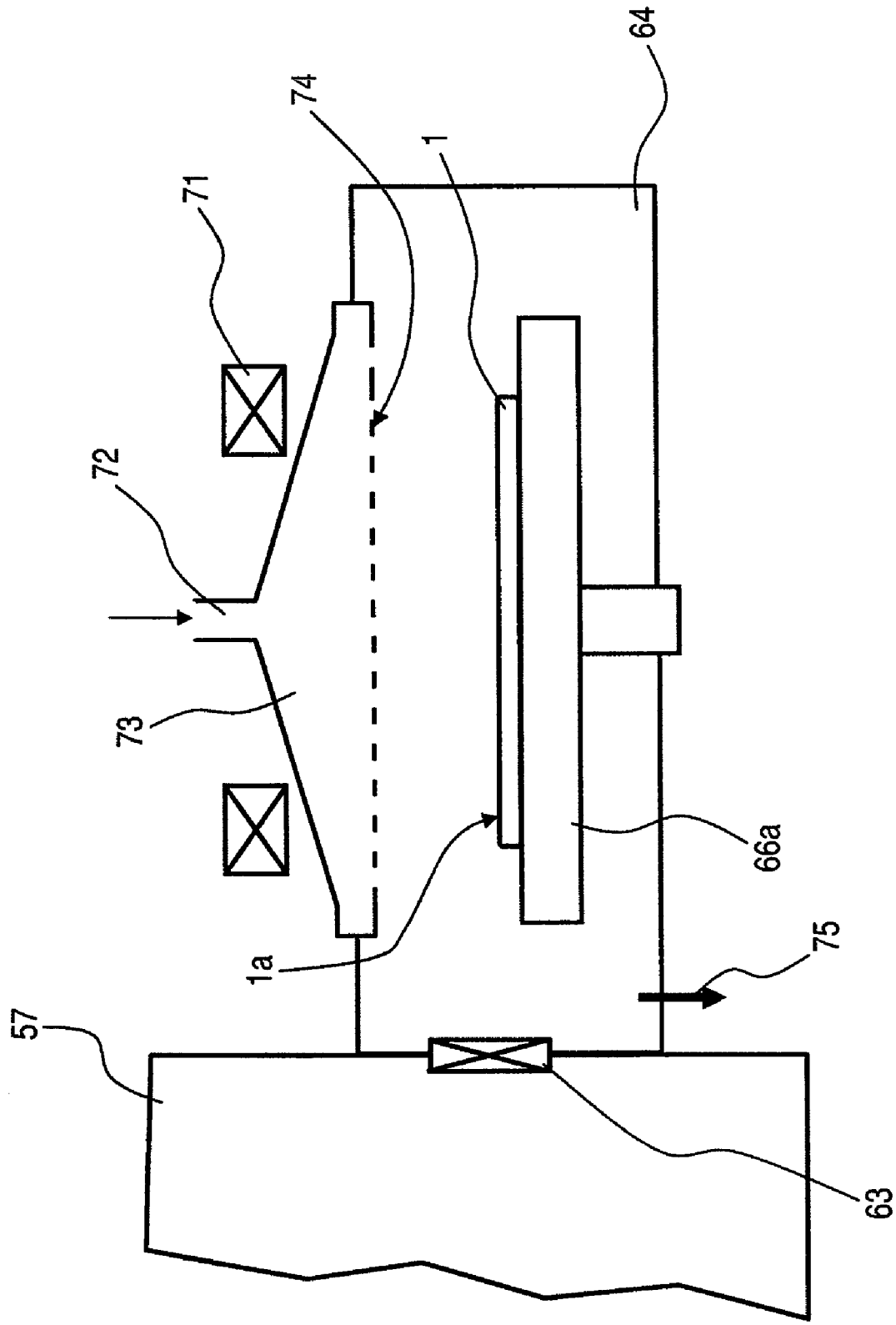
FIG. 5 is a cross-sectional view of an essential part of the baking/ashing device for use in various resist removal processes in the method for manufacturing a semiconductor device of one embodiment of the present application.

FIG. 4 is an overall planar structural view of a baking/ashing device for use in various resist removal processes in the method for manufacturing a semiconductor device of one embodiment of the present application. FIG. 5 is an essential part cross-sectional view (cross section along X-X' of FIG. 4) of the baking/ashing device for use in various resist removal processes in the method for manufacturing a semiconductor device of one embodiment of the present application. Herein, examples of the usable device include TIGMA-4 of PSK Co. A description will be given to the device for use in each ashing treatment in the method for manufacturing a semiconductor integrated circuit device of one embodiment of the present application based on these.

First, a description will be given to the overall structure and the flow of a wafer 1 of a baking and ashing device 51. As shown in FIG. 4 or 5, each to-be-treated wafer 1 is set in a load port 52 while being stored in a hoop 53 (container for sending back wafers). In the state, it is coupled to a local cleaning chamber 54 via a gate. Then, the wafer 1 in the hoop 53 is taken into the local cleaning chamber 54 kept at roughly atmospheric pressure by a transport robot 55. Then, each wafer 1 is transferred to a transport robot 58 in a front chamber 57 kept at roughly atmospheric pressure via a gate 61. Thereafter, the wafers 1 are mounted on wafer stages 66a, 66b, 67a, and 67b in treatment chambers 64 and 65 via gates 62 and 63 by the transport robot 58 (herein, the case where the wafer 1 is mounted on the wafer stage 66a of the treatment chamber 64 will be described). Over the wafer stage 66a, a baking treatment under atmospheric pressure, a soft ashing treatment under reduced pressure, and a hard ashing treatment (which are referred to as an "ashing treatment" all together) are successively carried out. As shown in FIG. 5, the plasma in the ashing treatment is generated by exciting a gas containing oxygen as a main component introduced into a plasma excitation chamber 73 through the gas inlet 72 with a high frequency power applied to, for example, an ICP (inductively coupled plasma) type plasma excitation mechanism 71. The formed plasma passes through a large number of openings of a punching board 74, and reaches the device side 1a (first main surface) (a so-called remote plasma). Then, the gas is exhausted outside of the furnace by a vacuum exhaust system through an exhaust passage 75.

The completely treated wafer 1 is returned to the front chamber again by the wafer robot 58 via a gate 63. Then, the wafer 1 is transferred from there via the gate 61 to the wafer robot 55, and returned to the hoop 53 coupled with the local cleaning chamber 54.

Incidentally, the remote plasma method has a merit of causing less damage to the device. However, a general in situ type plasma method is also similarly applicable. Further, the excitation method is not limited to the ICP method, and other methods are also similarly applicable.

2. Explanation of the Flow of Each Ashing Treatment in the Method for Manufacturing a Semiconductor Integrated Circuit Device of One Embodiment of the Present Application (Mainly FIGS. 1 to 3)

The resist removal process herein described is widely applicable to removal of the resist film pattern (including the entire resist film). Specifically, the resist removal process is effectively applicable to the resist removal steps 155, 157, 162, 164, 166, 171, 173, and the like (ion implantation step 101 of FIG. 1) described in connection with FIG. 6 or the like of Section 3. Out of these, the resist removal process is effectively applicable to the resist removal steps 155, 157, 166, 171, 173, and the like after high-concentration ion implantation.

2-1. Explanation of High-Temperature and Oxygen Gas Process (Mainly FIGS. 1 and 2)

FIG. 1 is a process block flowchart showing the flow of the resist removal process (high-temperature and oxygen gas ashing treatment) in the method for manufacturing a semiconductor device of one embodiment of the present application. FIG. 2 is a process time chart showing the flow of the baking and ashing treatment in the resist removal process in the method for manufacturing a semiconductor device of one embodiment of the present application. Based on these, the high-temperature and oxygen gas process will be described.

A description will be given to the flow of from completion of ion implantation 101 to completion of a wet cleaning step 105 which is the final step of a resist removal step 106 (FIG. 1). As shown in FIG. 1 or 2 (see FIGS. 4 and 5), each wafer 1 completely subjected to the ion implantation step 101 is placed on the wafer stages 66, 67, or the like of the resist removing device 51 with the device side 1a facing upward (time t1 of FIG. 2). The wafer stages 66 and 67 are normally heated or heat regulated at around 300 degrees centigrade (setting temperature). At this step, the atmosphere of the treatment chambers 64 and 65 may be a roughly atmospheric pressure (e.g., about 101 kPa) dry air atmosphere (a nitrogen atmosphere, an inert gas atmosphere of argon, helium, or the like, or other atmospheres are also acceptable. However, the dry air atmosphere is most economical). On each wafer 1, a baking treatment 102 (in situ baking) is carried out (baking period T1 of FIG. 2) is carried out over the wafer stages 66 and 67 for about 10 seconds in order to volatize the solvent in the resist. Thereafter (time t2 of FIG. 2), without change, the pressure of the treatment chambers 64 and 65 is reduced to, for example, about 50 Pa (t3 of FIG. 2). Thus, the atmosphere is replaced with an oxygen gas atmosphere (oxygen gas constant flow rate, roughly the stationary state of, for example, about 2000 sccm). In this state, a high frequency power of about 1500 W (e.g., 2.45 GHz) is applied (time t4 of FIG. 2), so that plasma is excited. The excited plasma is borne on a stationary wave, and reaches the device side 1a of the wafer 1. This allows proceeding of a soft ashing treatment 103 (preparatory plasma ashing treatment) of performing an ashing treatment on the crust part of the surface of the resist film pattern modified and hardened by high-concentration ion implantation (soft ashing period T2 of FIG. 2). The soft ashing period T2 is, for example, about 60 seconds. The crust part is roughly removed by this treatment.

Then, without change, the RF power is turned off (time t5 of FIG. 2), so that the process transfers to a hard ashing treatment 104. With the hard ashing treatment 104, the pressure is increased up to, for example, about 200 Pa, and then (time t6 of FIG. 2), the RF power is applied again (time t57 of FIG. 2). The flow rate of the oxygen gas is increased to, for example, about 11000 sccm. The high frequency power (e.g., 2.45 GHz) is also set at about 5500 W (generally, a higher electric power than with soft ashing is applied). As a result, the inside soft core portion can be completely removed. Upon completion of the hard ashing treatment 104 (main plasma ashing treatment; hard ashing period T3 of FIG. 2), the RF power is turned off (time t8 of FIG. 2). Thus, the atmosphere is replaced with a dry air, and the pressure starts to increase toward atmospheric pressure (time t9 of FIG. 2). The hard ashing period T3 is, for example, about 180 seconds. When the treatment chambers 64 and 65 (treatment chambers in which the treatments have been completed) are returned to atmospheric pressure (time 10 of FIG. 2), each wafer 1 is returned to the hoop 53. Thereafter, the wafer 1 is stored in the hoop 53, and is transported to a wet cleaning device.

Incidentally, the reason why the ashing treatment is divided into the soft ashing treatment 103 and the hard ashing treatment 104 can be described as follows. Namely, by high dose ion implantation, the polymer chain in the resist surface is changed into a stronger multiple bond to form a so-called hardened layer (crust part). A strong plasma is allowed to act on this from the beginning. Then, the hardened layer is further hardened, so that the ashing reaction does not proceed at all. In order to prevent such a state from occurring, the surface is gradually cut away with a weak plasma at first. Then, when the hardened layer nearly disappears, a strong plasma is allowed to act thereon.

With the wet cleaning device (e.g., a sheet-fed type wet cleaning device), a wet cleaning treatment 105 for cleaning the wafer surface is carried out. The wet cleaning treatment proceeds, for example, in the following manner. The order of treatments is the following numerical order. (1) An APM cleaning solution (ammonia, hydrogen peroxide, water) at about 23 degrees centigrade is supplied to the device side 1a of the wafer 1 spinning on its axis over the wafer spin stage by a nozzle. The treatment time is, for example, about 30 seconds. (2) The wafer is washed with water. (3) A HPM cleaning solution (hydrochloric acid, hydrogen peroxide, water) at about 23 degrees centigrade is supplied to the device side 1a of the wafer 1 spinning on its axis over the wafer spin stage by a nozzle. The treatment time is, for example, about 30 seconds. (4) The wafer is washed with water. (5) A SPM cleaning solution (ammonia, hydrogen peroxide, water) at about 130 degrees centigrade is supplied to the device side 1a of the wafer 1 spinning on its axis over the wafer spin stage by a nozzle. The treatment time is, for example, about 300 seconds. (6) The wafer is washed with water. (7) An APM cleaning solution (ammonia, hydrogen peroxide, water) at about 65 degrees centigrade is supplied to the device side 1a of the wafer 1 spinning on its axis over the wafer spin stage by a nozzle. The treatment time is, for example, about 300 seconds. (8) The wafer is washed with water. (9) The device side 1a of the wafer 1 is washed with water, and is subjected to a drying treatment.

Upon completion of the wet cleaning treatment 105, the wafer 1 is transferred to the subsequent step.

Incidentally, throughout the baking treatment 102, the soft ashing treatment 103 (first plasma ashing treatment), the hard ashing treatment (second plasma ashing treatment) 104, and the period therebetween, the temperature is desirably kept at a constant temperature within a prescribed temperature range (e.g., 265 degrees centigrade or more and less than 350 degrees centigrade). The temperature may be varied within a prescribed temperature range. However, generally, the control of the temperature at a constant temperature is more simple. This is due to the following fact. Throughout the baking treatment 102, the soft ashing treatment 103 (first plasma ashing treatment), the hard ashing treatment (second plasma ashing treatment) 104, and the period therebetween, the wafer 1 is over, for example, the wafer stage 66a, namely, over the same stage 66a, 66b, 67a, or 67b. The upper limit of this temperature range is required in order to avoid the bad effect of heat on the surroundings. On the other hand, the lower limit is required in order to make practical the rate of the removal reaction. In the mass production step, the treatment rate is important. In order to ensure the stable treatment, the lower limit is desirably 270 degrees centigrade or more. Further, in order to improve the throughput, 280 degrees centigrade or more is preferable.

Whereas, for the oxygen gas atmosphere to be kept throughout the soft ashing treatment 103 (first plasma ashing treatment), the hard ashing treatment (second plasma ashing treatment) 104, and the period therebetween, the addition rate is desirably less than 3 vol % in order to avoid undesirable sputtering effects and chemical actions. However, the addition rate is in particular preferably less than 2 vol %, and if possible, less than 1 vol % in consideration of the effects on the device, or the effects of the mass production on the device.

2-2. Explanation of Improvement of Soft Ashing Step (Mainly FIG. 3)

The plasma interruption soft ashing process herein described is explained as the improvement of the soft ashing process of the high-temperature and oxygen gas process of Sub-section (2-1). Therefore, for the matters not described below, reference is made to Sub-section (2-1) roughly as it is. However, the plasma interruption soft ashing process itself as an element treatment is effective in a wide pressure range (range in which a plasma can be excited), a wide temperature range (including a low temperature region, from about 110 degrees centigrade to 350 degrees centigrade being valid), and a wide range of gas atmospheres containing oxygen as a main component (an atmosphere containing additive gases other than oxygen, i.e., nitrogen, a forming gas (a mixed gas obtained by diluting hydrogen with nitrogen, generally, in the proportions of about 3 parts hydrogen to 100 parts nitrogen), an etching gas (fluorine-containing gas such as a SF type gas), or the like). Therefore, changing of temperature setting or the gas atmosphere eliminates the absolute necessity of one of, or both of the preceding baking treatment (e.g., the case where ashing is carried out in the low temperature region), and the subsequent hard ashing treatment. However, it is naturally understood that, when the hard ashing treatment is not carried out, elongation of the time of the soft ashing step as much, or other measures become necessary. Incidentally, when the temperature of the wafer stage (wafer temperature) for the ashing treatment is set at less than 265 degrees centigrade, not an oxygen gas atmosphere but a gas having a sputtering effect or etchability is desirably added. The addition ratio within the range of about 5% or more and less than 30% is practical in any case.

Figure 3B:
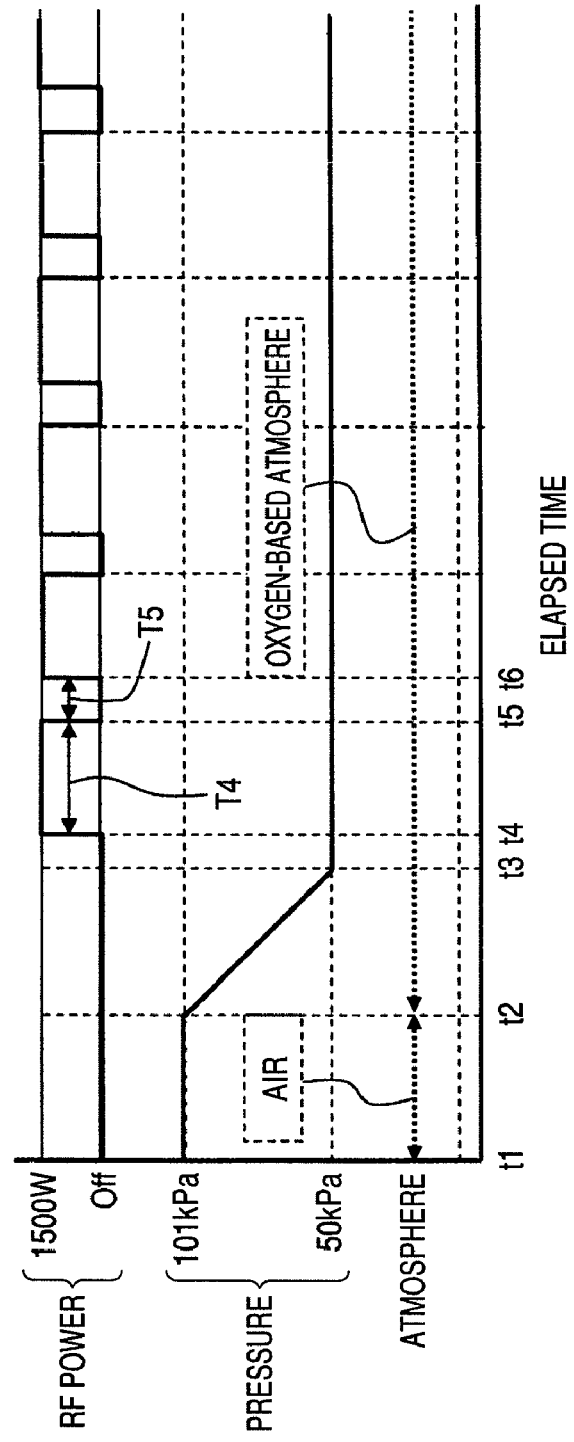

FIGS. 3A and 3B are a process block flowchart (FIG. 3A) and a process time chart (FIG. 3B) in the resist removal process in the method for manufacturing a semiconductor device of one embodiment of the present application. By reference to these, the plasma interruption treatment soft ashing process will be described.

The soft ashing step 103 (FIG. 1) of the ashing process previously described includes a basically continuous single step. However, in the example herein described, the soft ashing step 117 (FIG. 3) includes a plurality of soft ashing steps 113 and 114 (first and second plasma ashing treatments), between which a plasma excitation stop step 118 for stopping the plasma excitation (or a plasma atmosphere supply stop step) is present. Namely, as shown in FIG. 3A or 3B, for the wafer 1 completely subjected to the ion implantation step 101 or the wafer 1 completely subjected to the subsequent baking, reduction of pressure is started (time t2 of FIG. 3) from a nearly atmospheric pressure dry air atmosphere state (time t1 of FIG. 3). Nearly simultaneously therewith, the atmosphere is replaced with an atmosphere containing oxygen as a main component (oxygen-based atmosphere) (the flow rate of the oxygen-based atmosphere is about 2000 sccm). After the pressure has reached a reduced pressure state of about 50 Pa (time t3 of FIG. 3), in that state, a RF power (2.45 GHz, about 1500 W) is applied (time t4 of FIG. 3). Thereafter, the RF power is turned off in a relatively short time (time t5 of FIG. 3). However, at this step, the gas atmosphere is still the oxygen-based atmosphere. After N repetitions of the excitation period T4 and the non-excitation period T5 in this manner, generally, the process transfers to hard ashing as at time t5 or later of FIG. 2.

Herein, in consideration of, for example, the case where the atmosphere is an oxygen gas atmosphere, and the wafer temperature (stage temperature), and other conditions are roughly the same as those in Sub-section (2-1), the total excitation period T4 can be set at, for example, about 60 seconds (in view of the ashing characteristics, 30 seconds or more is desirable), and the non-excitation period T5 can be set at, for example, about 10 seconds. This results in that each excitation period T4 is about 30 seconds when the number N of additional repetitions of FIG. 3A is assumed to be 0 (first example). However, it has been confirmed that a non-excitation period T5 of 5 seconds to 10 seconds or more provides an effect of relaxing the resist surface. Therefore, each excitation period T4 is set at about 20 seconds, and the number N of additional repetitions of FIG. 3A is set at 1. As a result, the non-excitation period T5 is about 10 seconds, and the total non-excitation period is about 20 seconds. Thus, the total soft ashing time is about 80 seconds (second example).

The number N of additional repetitions is considered to be about 0 or more and less than 10 because the time allotment like that of the first example or the second example is generally considered to be preferable. The upper limit is due to the requirement in view of mass production. For example, in the case of N=10, even when the excitation period T4 is reduced down to 10 seconds (in the case of 20 seconds as with the second example), the total excitation period is 120 seconds (240 seconds). In addition, the total non excitation period is 110 seconds, and the total soft ashing time is 230 seconds (350 seconds), and is 3 times (5 times) or more the total soft ashing time of 70 seconds of the first example. When the baking time is 10 seconds, the hard ashing time is 180 seconds. Accordingly, the total ashing time is 420 seconds (540 seconds), and is roughly about twice the total ashing time of 260 seconds of the first example. Therefore, N=about 10 is conceivably the upper limit of the preferable range.

On the other hand, the lower limit is determined by the state (degree of hardening) of the resist, or the treatment temperature. Generally, the total excitation period needs about 40 seconds to 70 seconds. Therefore, when the excitation period T4 is 30 seconds, the total number of repetitions of the excitation period is about 2 (N=0). When the excitation period T4 is 20 seconds, the total number of repetitions of the excitation period is about 3 (N=1). However, when the resist is further strongly hardened, or, when the temperature is relatively low (for example, less than 265 degrees centigrade, although the temperature is related to the gas atmosphere), N is required to be 2 or more.

The reason why the non-excitation period T5 is thus allowed to lie therebetween can be considered as follows. When the plasma treatment is continued for about 10 seconds to 30 seconds, the crust part of the hardened resist physio-chemically becomes hardened. Thus, the ashing reaction tends to delay. However, when the supply of a plasma is stopped (stop of plasma excitation or the stop of supply of a plasma itself), the tense state of the surface is relaxed. Thus, the resist returns to the easily reactable state again. In this case, in order to completely cut off the supply of a plasma, it is also possible to return the atmosphere to air (change the pressure), or to replace the atmosphere with a purge gas (without a change in pressure). However, only the stop of plasma excitation provides an effect of relaxation in several seconds. Therefore, no change in atmosphere (including pressure) has a larger time shortening effect in view of mass production. For example, the change in pressure requires the time for waiting for the stabilization of pressure, for example, a wait time of about 3 seconds. Further, gas purge or the like may require a further longer wait time. This, however, does not eliminate changing in pressure, gas composition, and the like for optimization.

3. Explanation of One Example of the Device Cross Sectional Process Flow in the Method for Manufacturing a Semiconductor Integrated Circuit Device of One Embodiment of the Present Application (Mainly FIGS. 6 to 26)

Herein, a description will be given to one example of the main part of a series of semiconductor wafer treatment process including the ashing treatment described in Section 2 (90-nm technology node complementary MISFET type, i.e., CMIS type LSI process).

Figure 6:
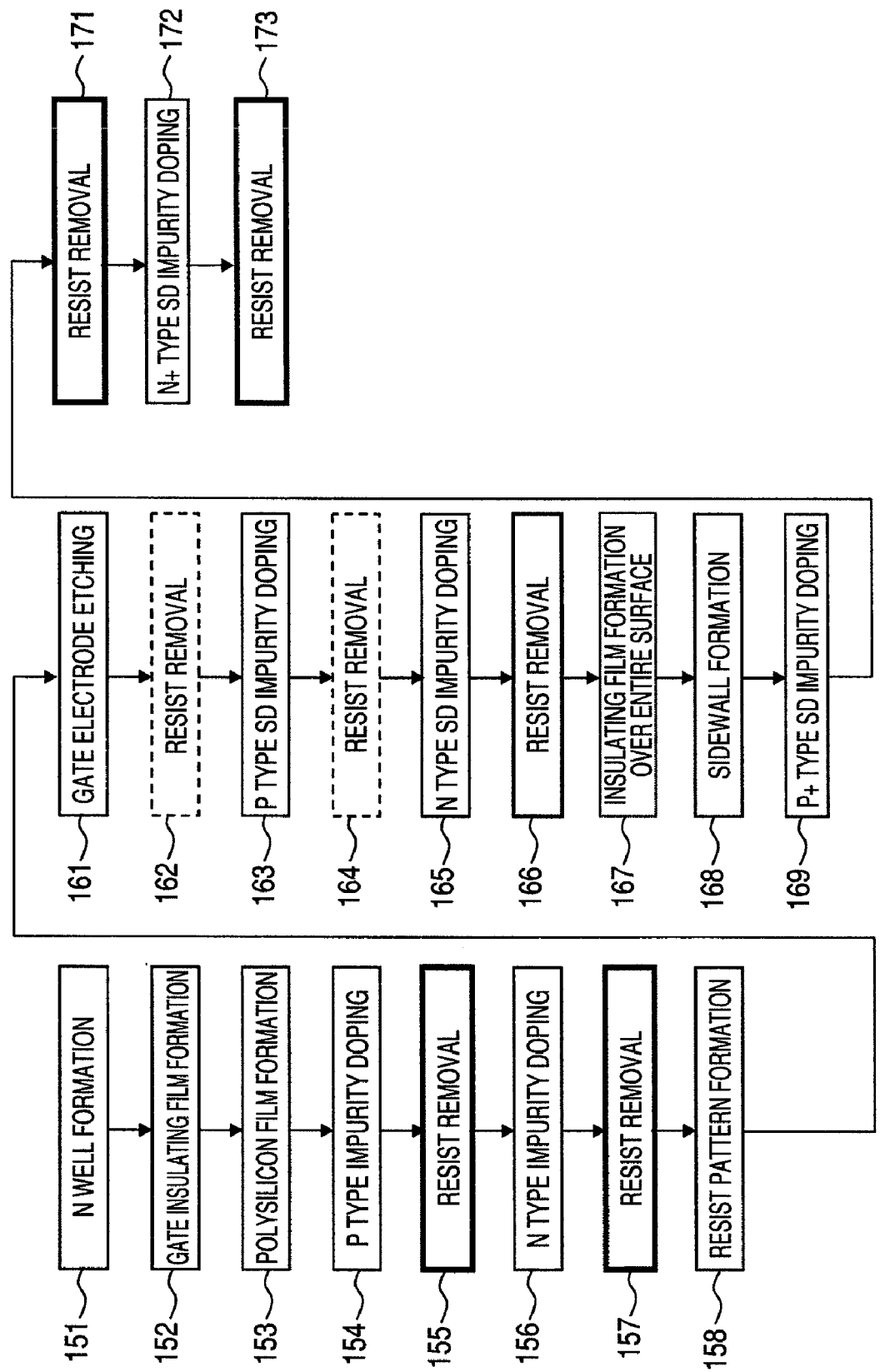
FIG. 6 is a process block flowchart showing the flow of the main part of the method for manufacturing a semiconductor device of one embodiment of the present application.
Figure 7:
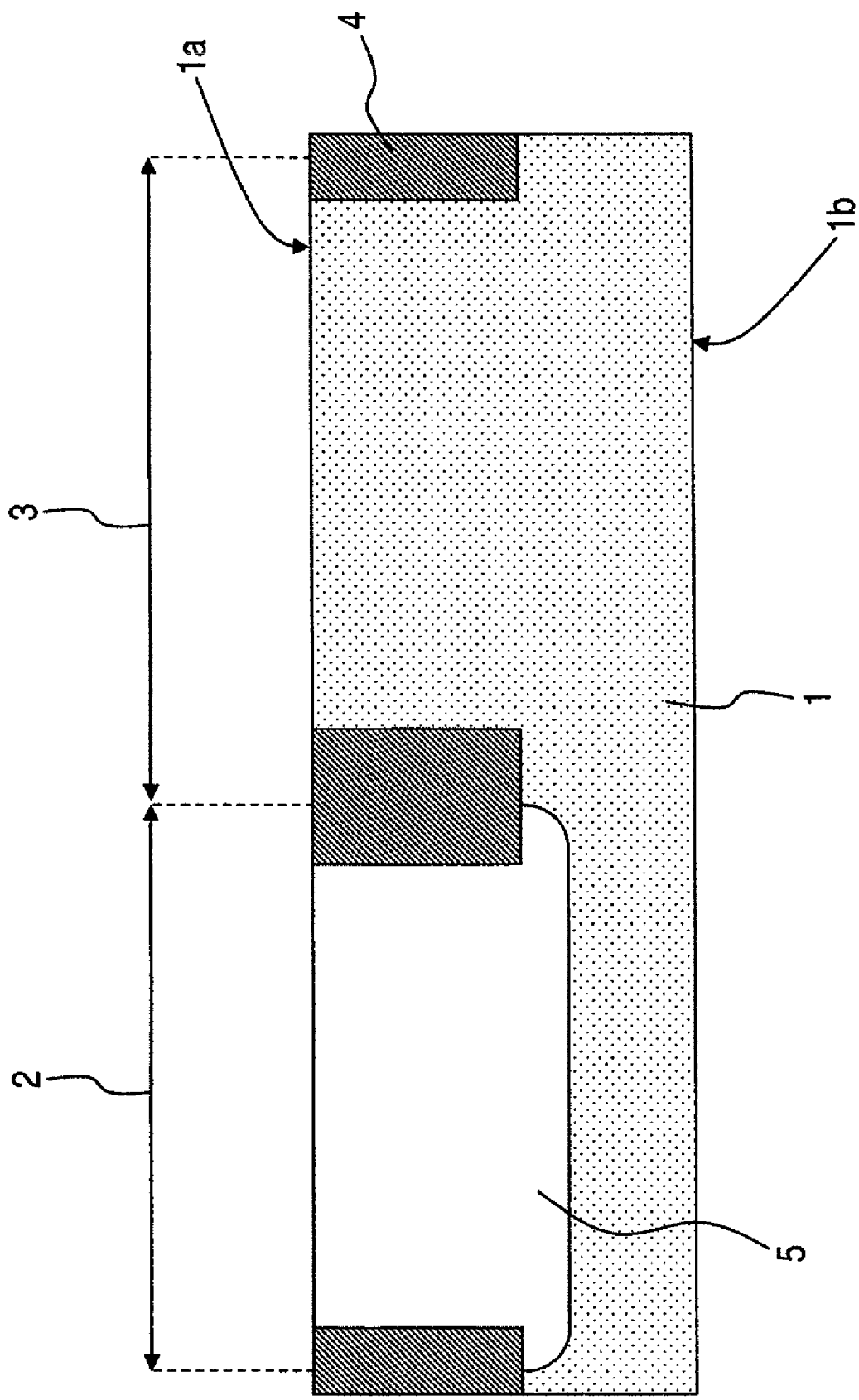
FIG. 7 is a device cross sectional flowchart (N wafer formation) showing the flow of the main part of the method for manufacturing a semiconductor device of one embodiment of the present application.
Figure 8:
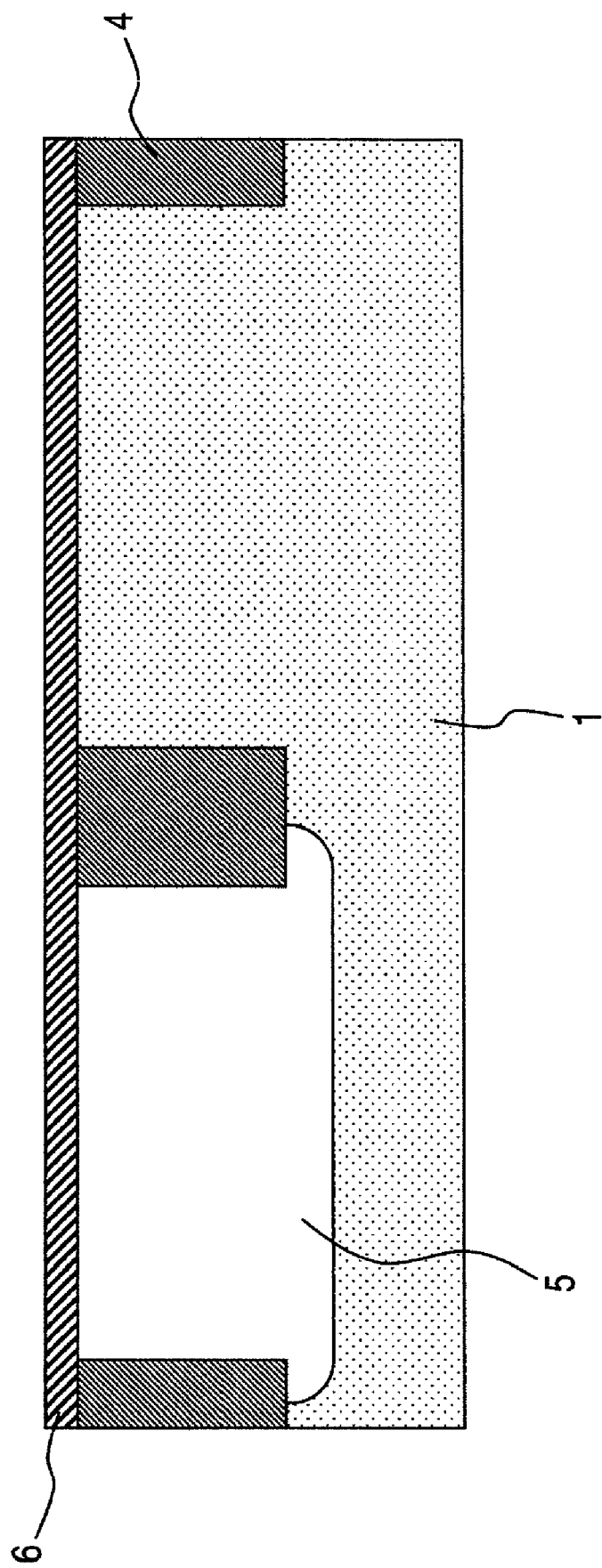
FIG. 8 is a device cross sectional flowchart (gate oxidation) showing the flow of the main part of the method for manufacturing a semiconductor device of one embodiment of the present application.
Figure 9:
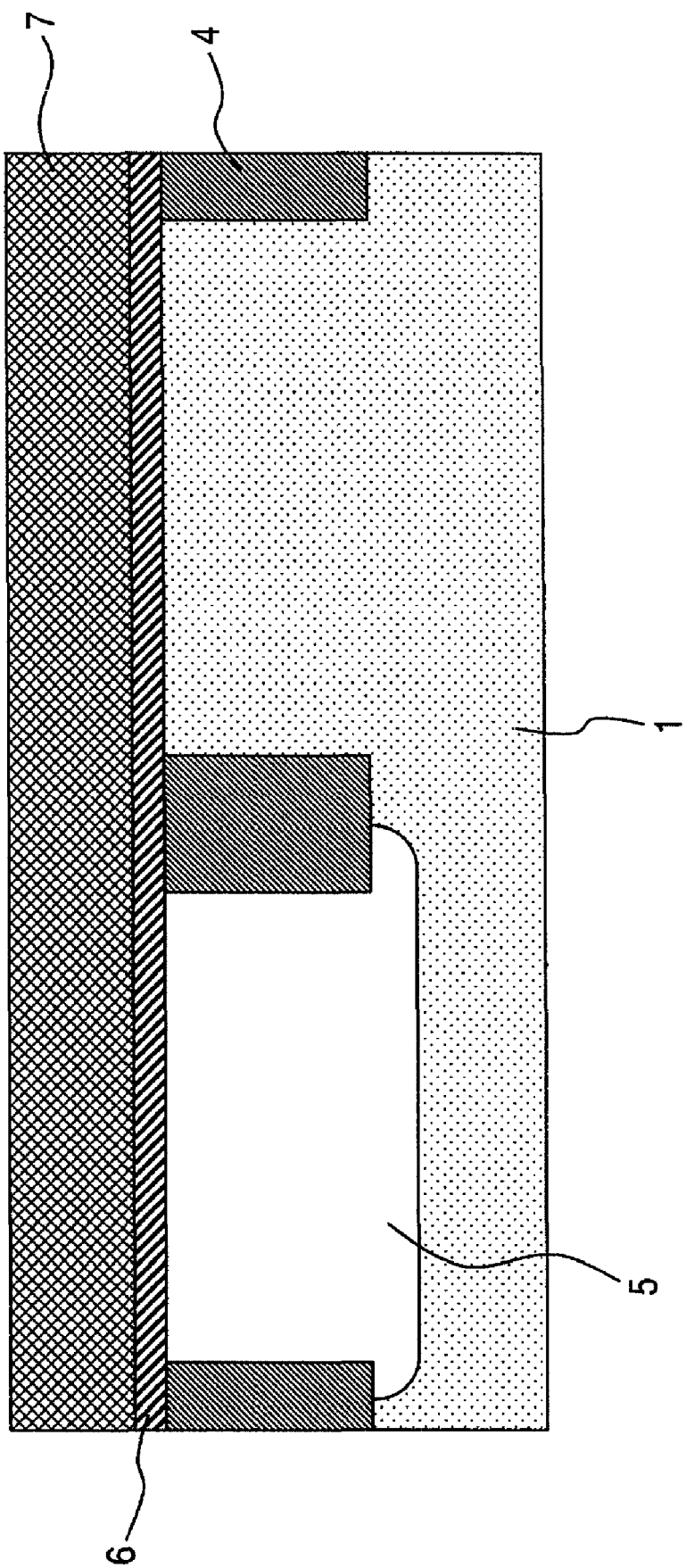
FIG. 9 is a device cross sectional flowchart (polysilicon film deposition) showing the flow of the main part of the method for manufacturing a semiconductor device of one embodiment of the present application.
Figure 10:
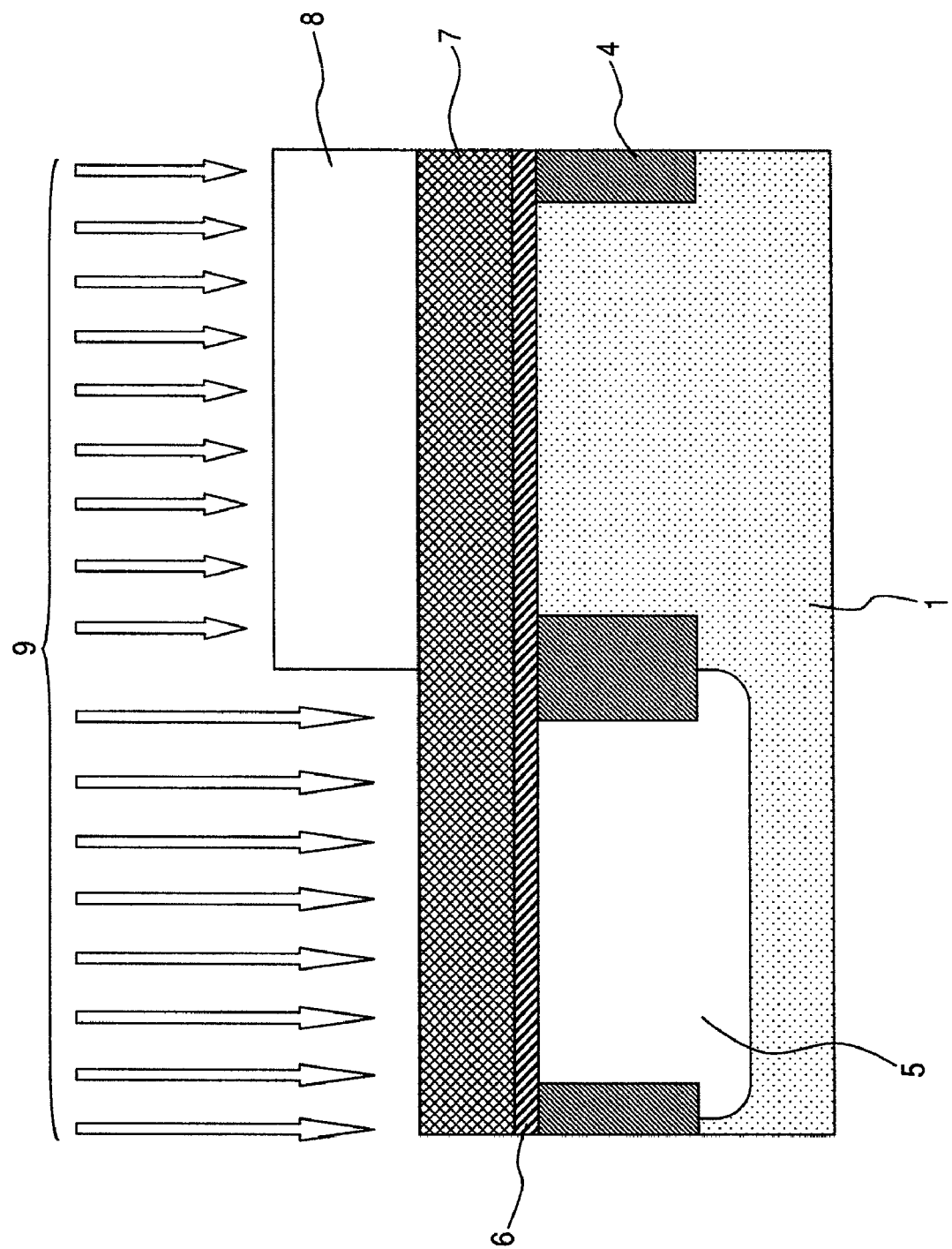
FIG. 10 is a device cross sectional flowchart (introduction of high-concentration P type impurities into the polysilicon film) showing the flow of the main part of the method for manufacturing a semiconductor device of one embodiment of the present application.
Figure 11:
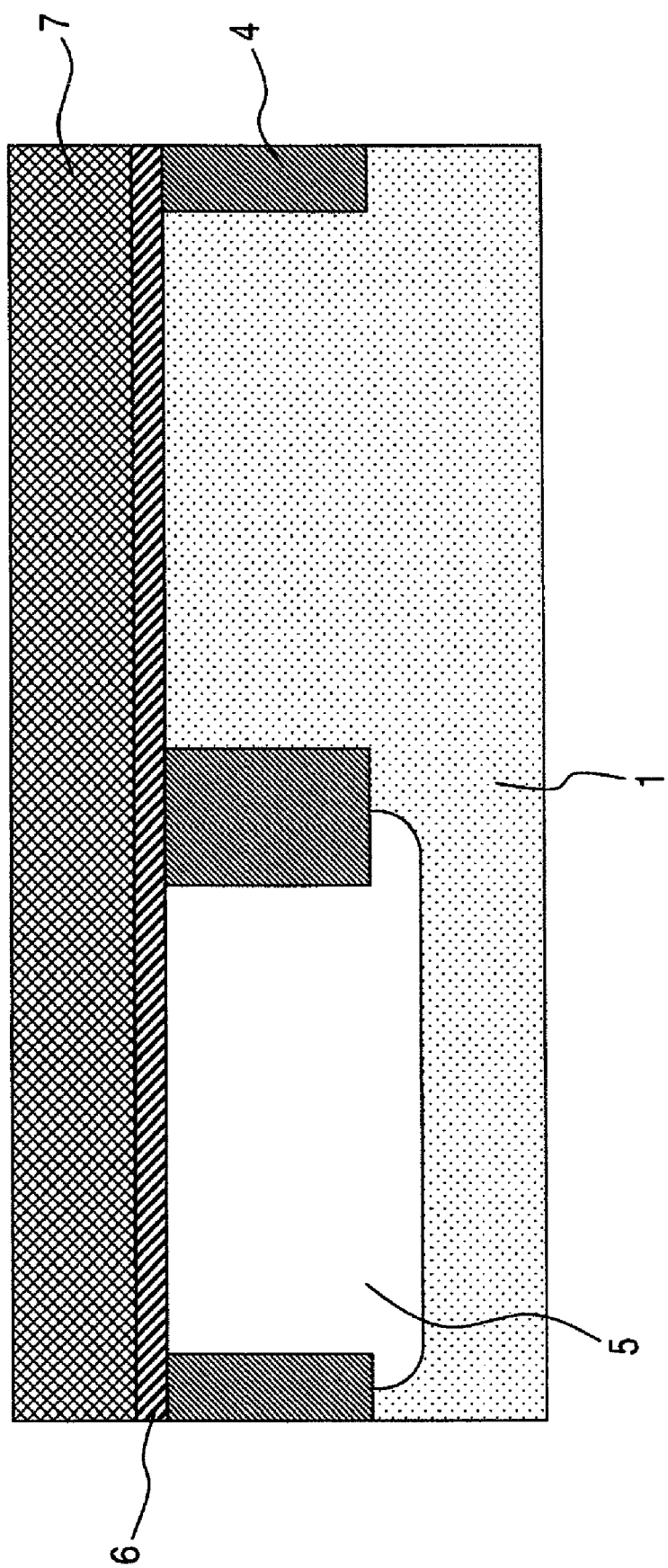
FIG. 11 is a device cross sectional flowchart (removal of the resist film pattern for introduction of P type impurities into the polysilicon film) showing the flow of the main part of the method for manufacturing a semiconductor device of one embodiment of the present application.
Figure 12:
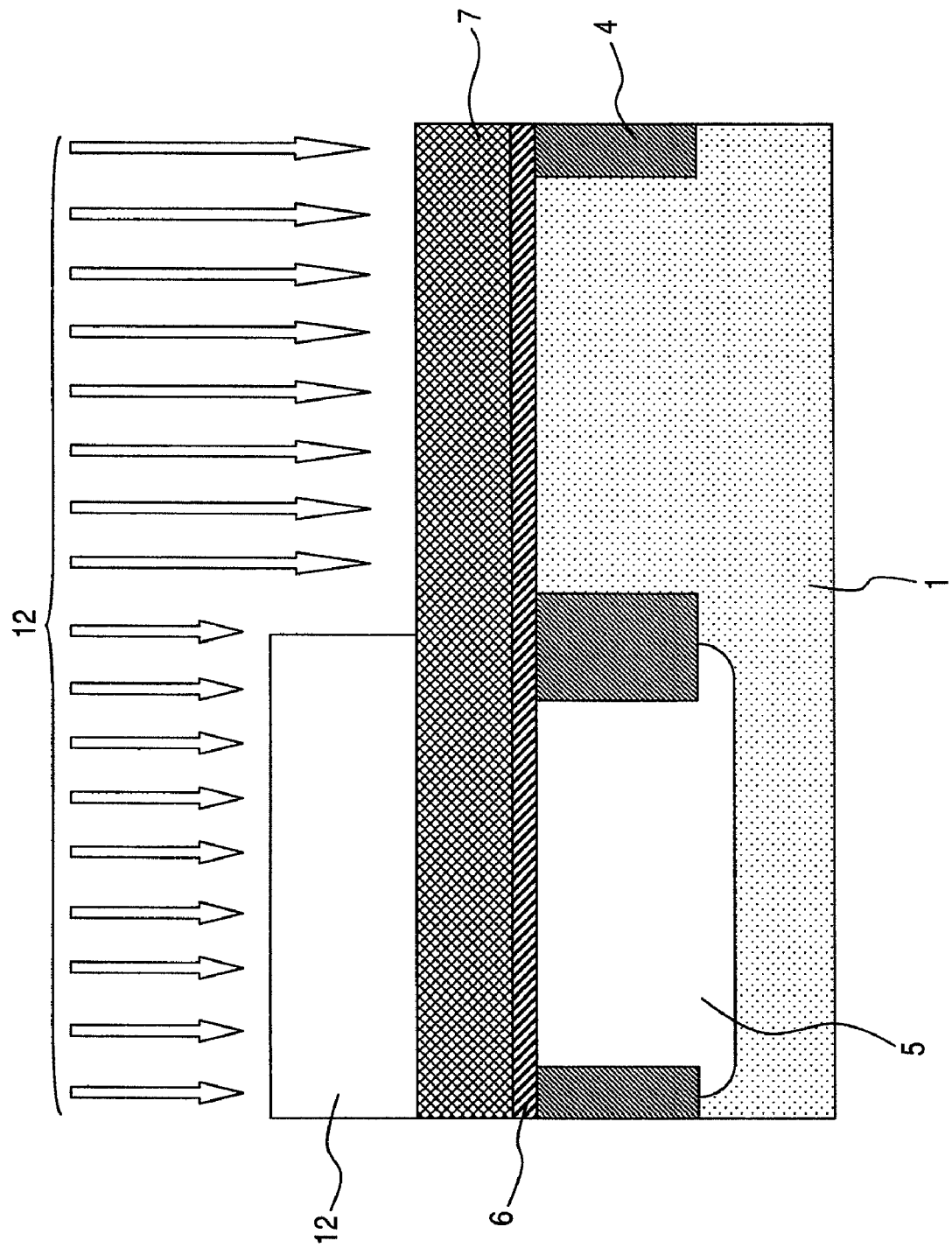
FIG. 12 is a device cross sectional flowchart (introduction of high-concentration N type impurities into the polysilicon film) showing the flow of the main part of the method for manufacturing a semiconductor device of one embodiment of the present application.
Figure 13:
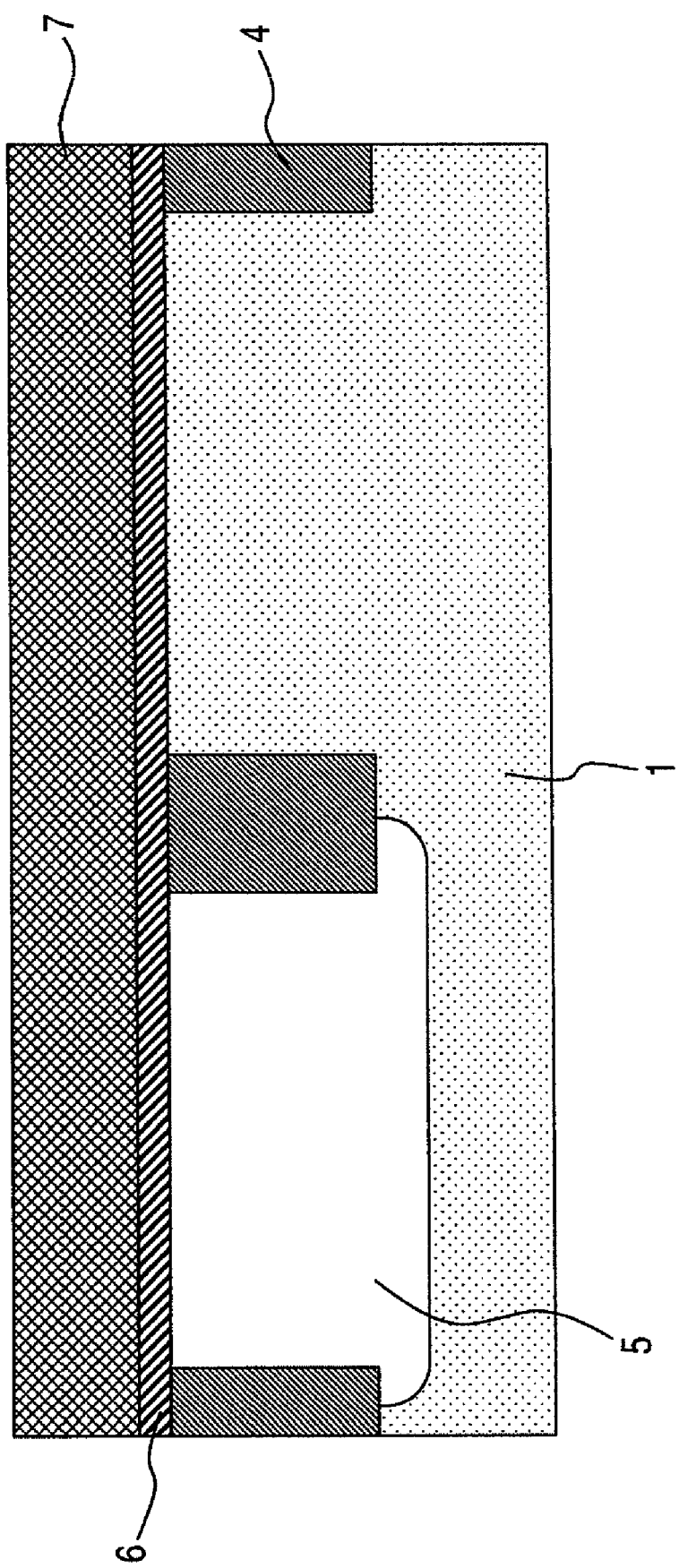
FIG. 13 is a device cross sectional flowchart (removal of the resist film pattern for introduction of N type impurities into the polysilicon film) showing the flow of the main part of the method for manufacturing a semiconductor device of one embodiment of the present application.
Figure 14:
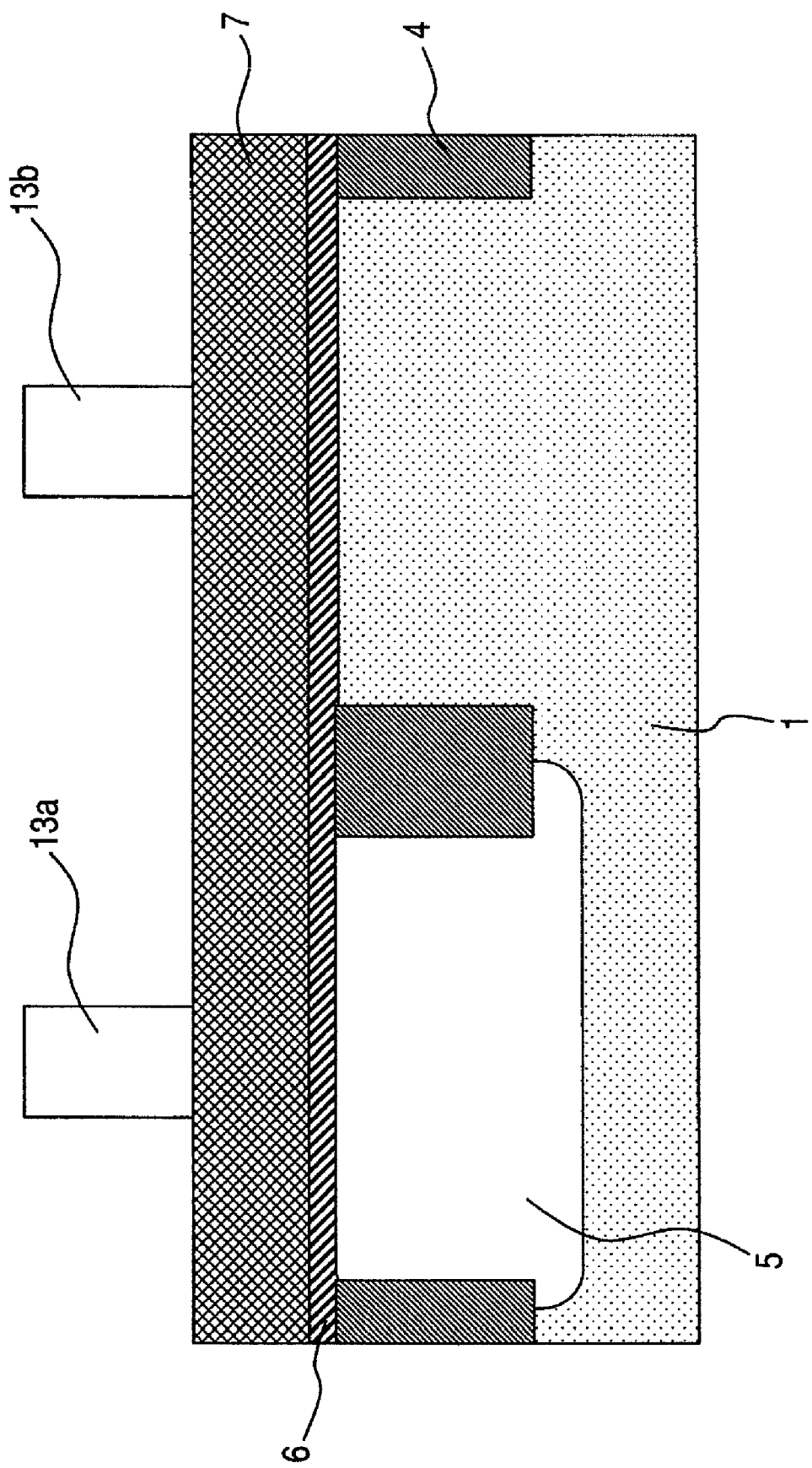
FIG. 14 is a device cross sectional flowchart (resist pattern formation for patterning of the polysilicon film) showing the flow of the main part of the method for manufacturing a semiconductor device of one embodiment of the present application.
Figure 15:
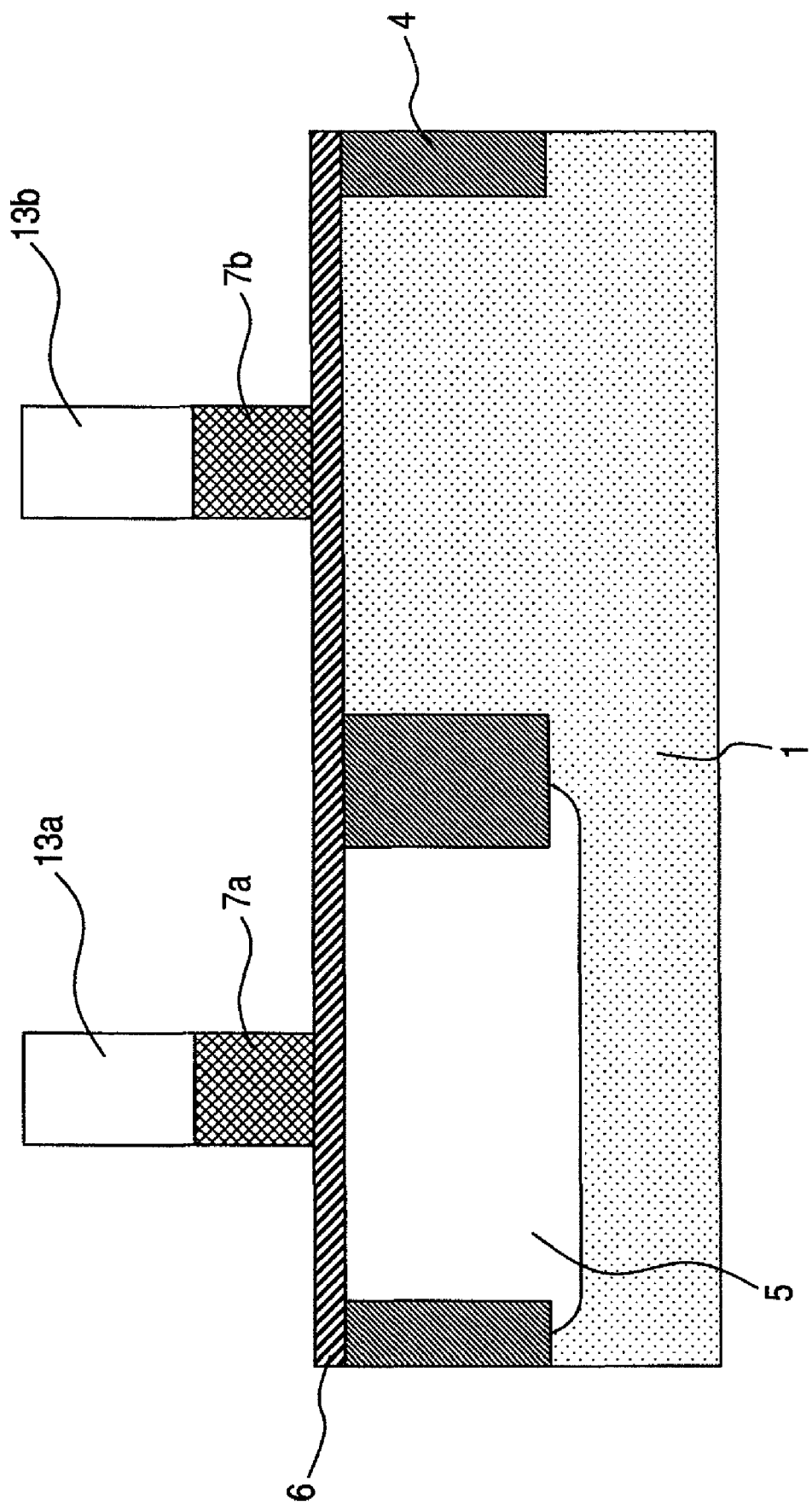
FIG. 15 is a device cross sectional flowchart (patterning of gate electrode) showing the flow of the main part of the method for manufacturing a semiconductor device of one embodiment of the present application.
Figure 16:
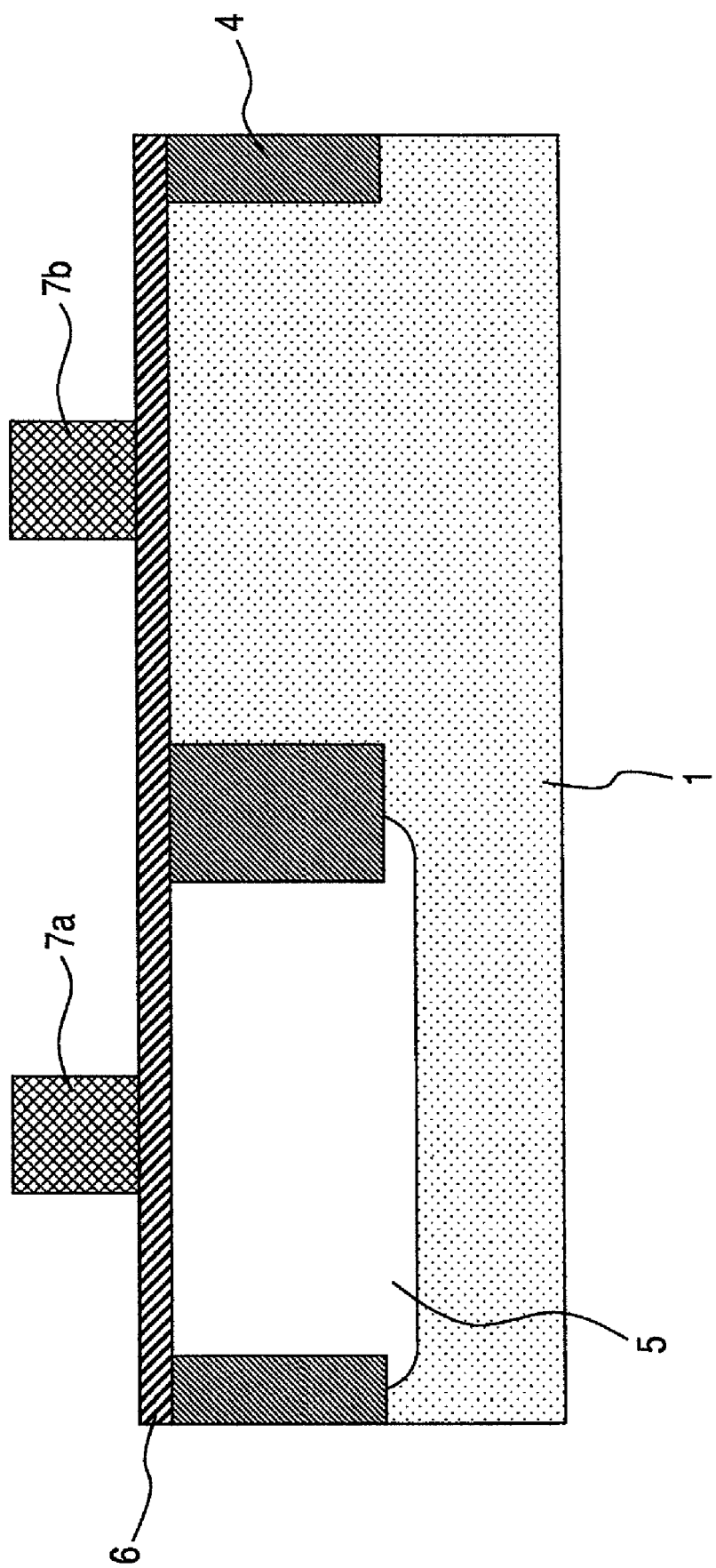
FIG. 16 is a device cross sectional flowchart (removal of the resist for patterning of gate electrode) showing the flow of the main part of the method for manufacturing a semiconductor device of one embodiment of the present application.
Figure 17:
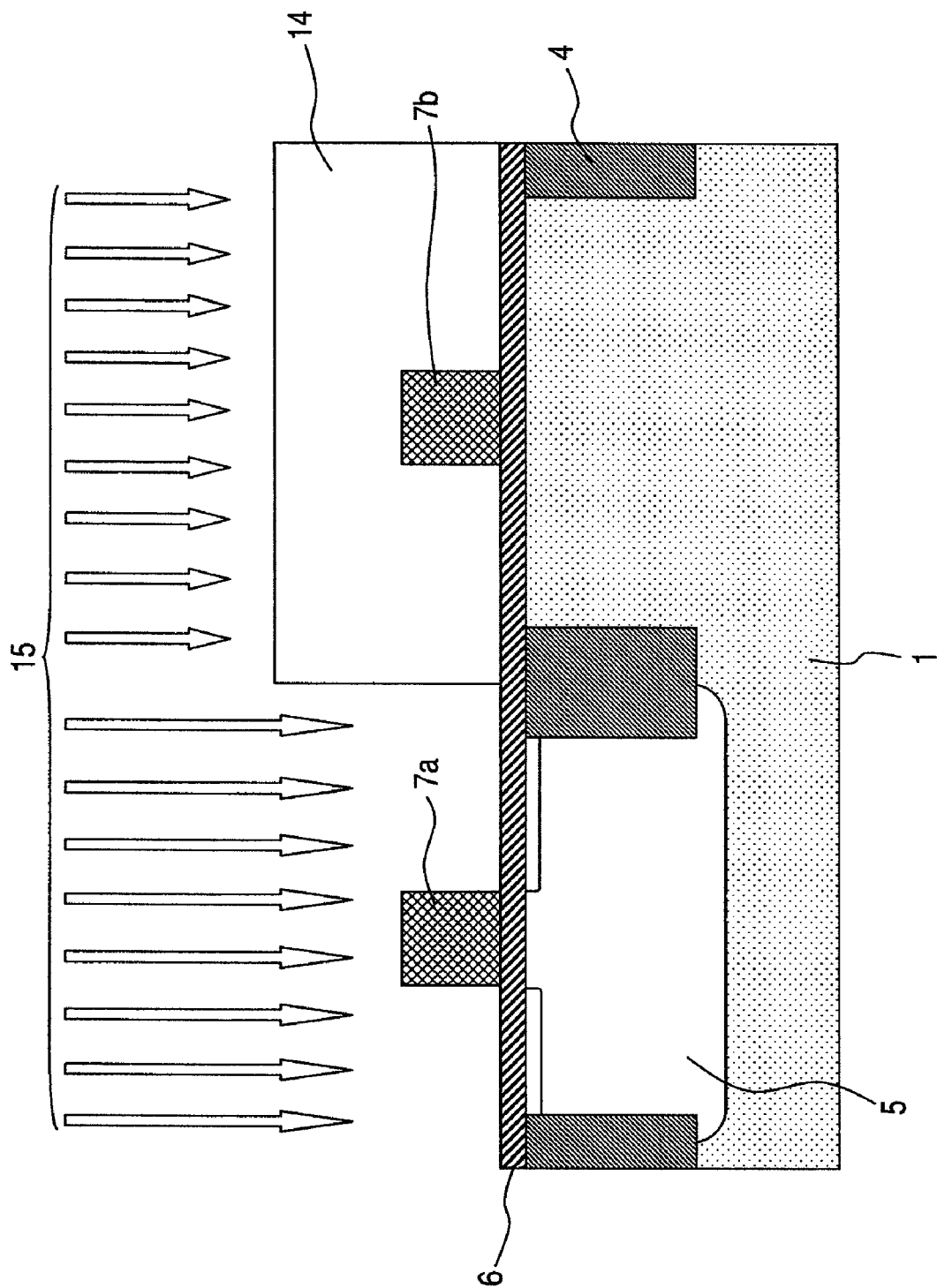
FIG. 17 is a device cross sectional flowchart (introduction of P type impurities into the source/drain extension of a P channel MISFET) showing the flow of the main part of the method for manufacturing a semiconductor device of one embodiment of the present application.
Figure 18:
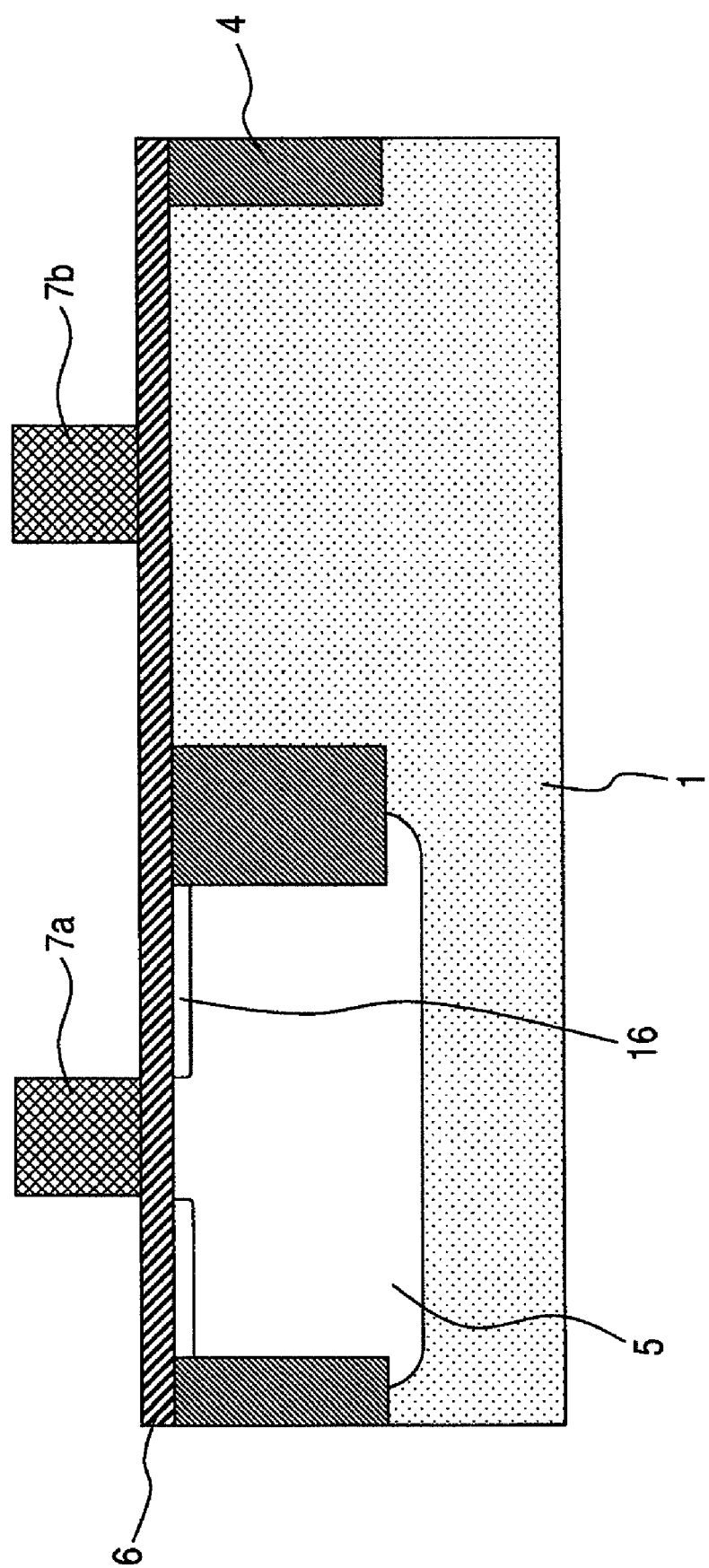
FIG. 18 is a device cross sectional flowchart (removal of the resist film pattern for introduction of P type impurities into the source/drain extension of a P channel MISFET) showing the flow of the main part of the method for manufacturing a semiconductor device of one embodiment of the present application.
Figure 19:
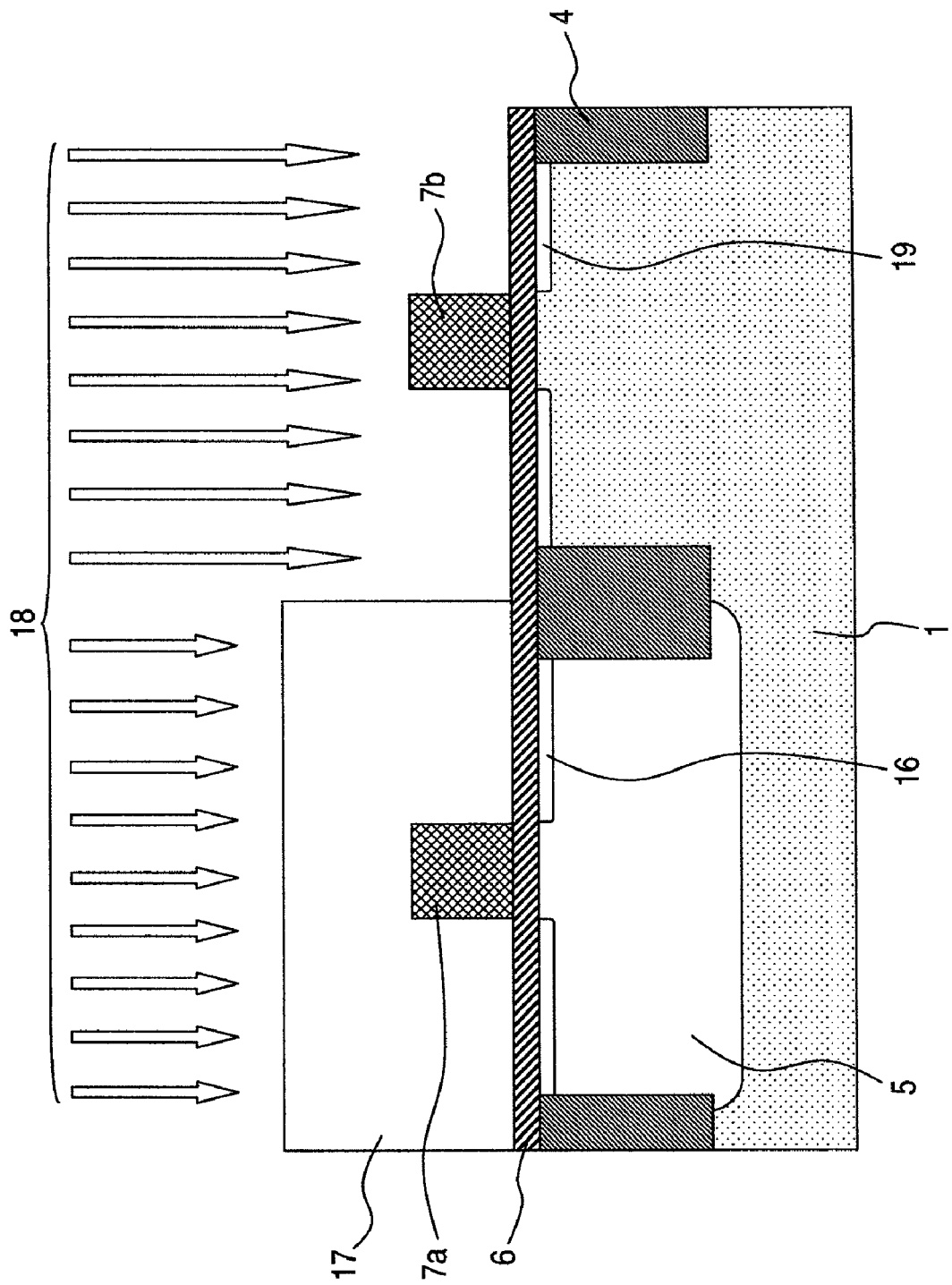
FIG. 19 is a device cross sectional flowchart (introduction of N type impurities into the source/drain extension of an N channel MISFET) showing the flow of the main part of the method for manufacturing a semiconductor device of one embodiment of the present application.
Figure 20:
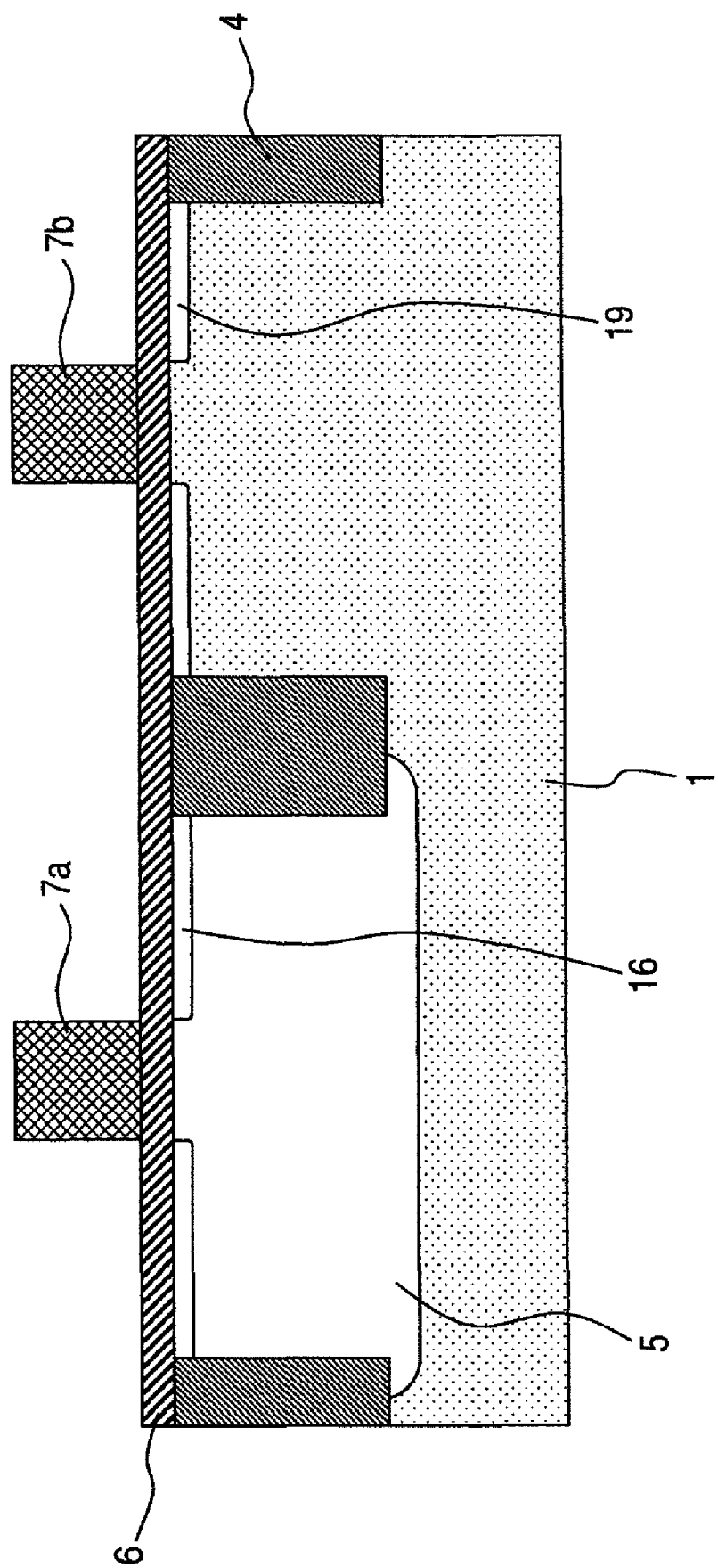
FIG. 20 is a device cross sectional flowchart (removal of the resist film pattern for introduction of N type impurities into the source/drain extension of an N channel MISFET) showing the flow of the main part of the method for manufacturing a semiconductor device of one embodiment of the present application.
Figure 21:
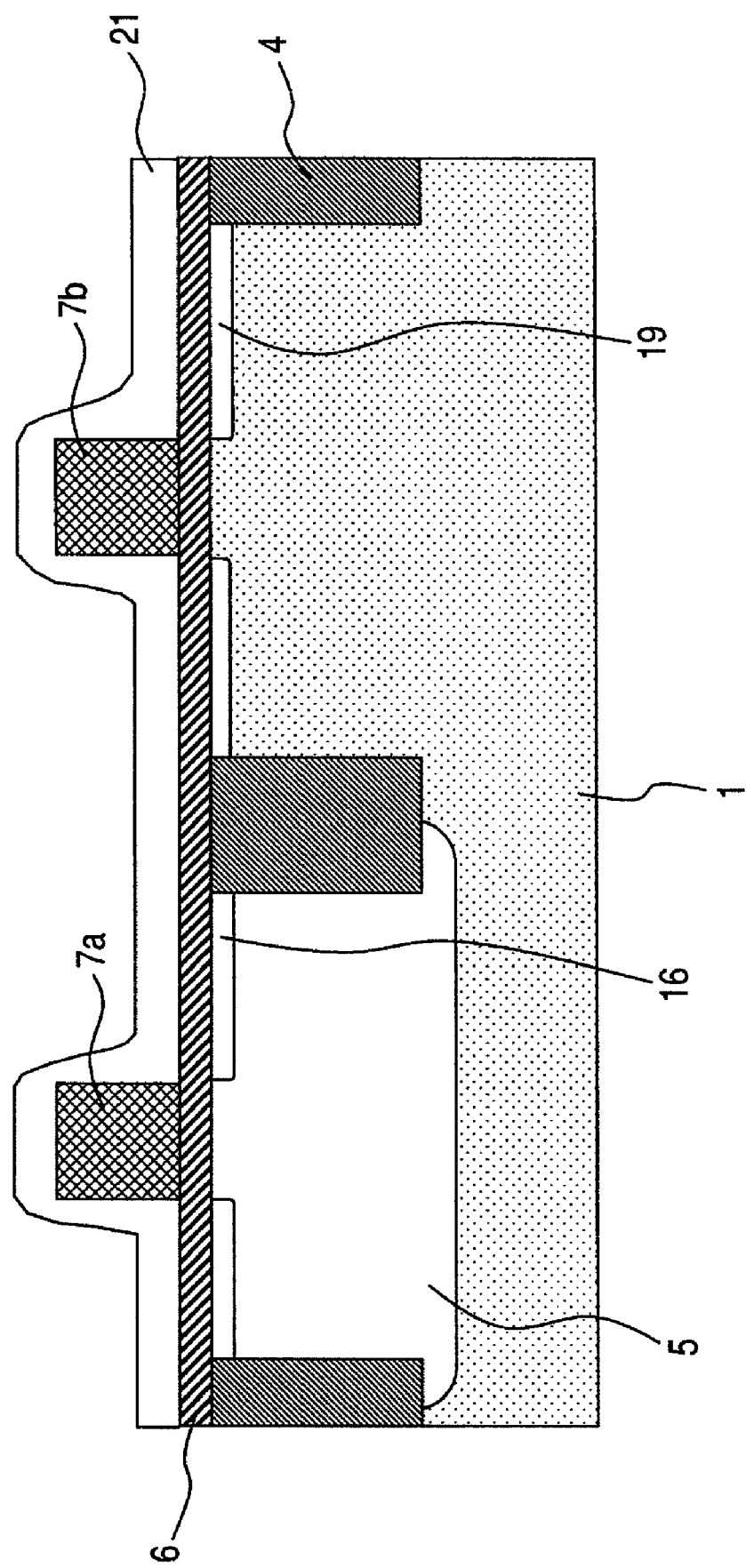
FIG. 21 is a device cross sectional flowchart (insulating film deposition for sidewall formation) showing the flow of the main part of the method for manufacturing a semiconductor device of one embodiment of the present application.
Figure 22:
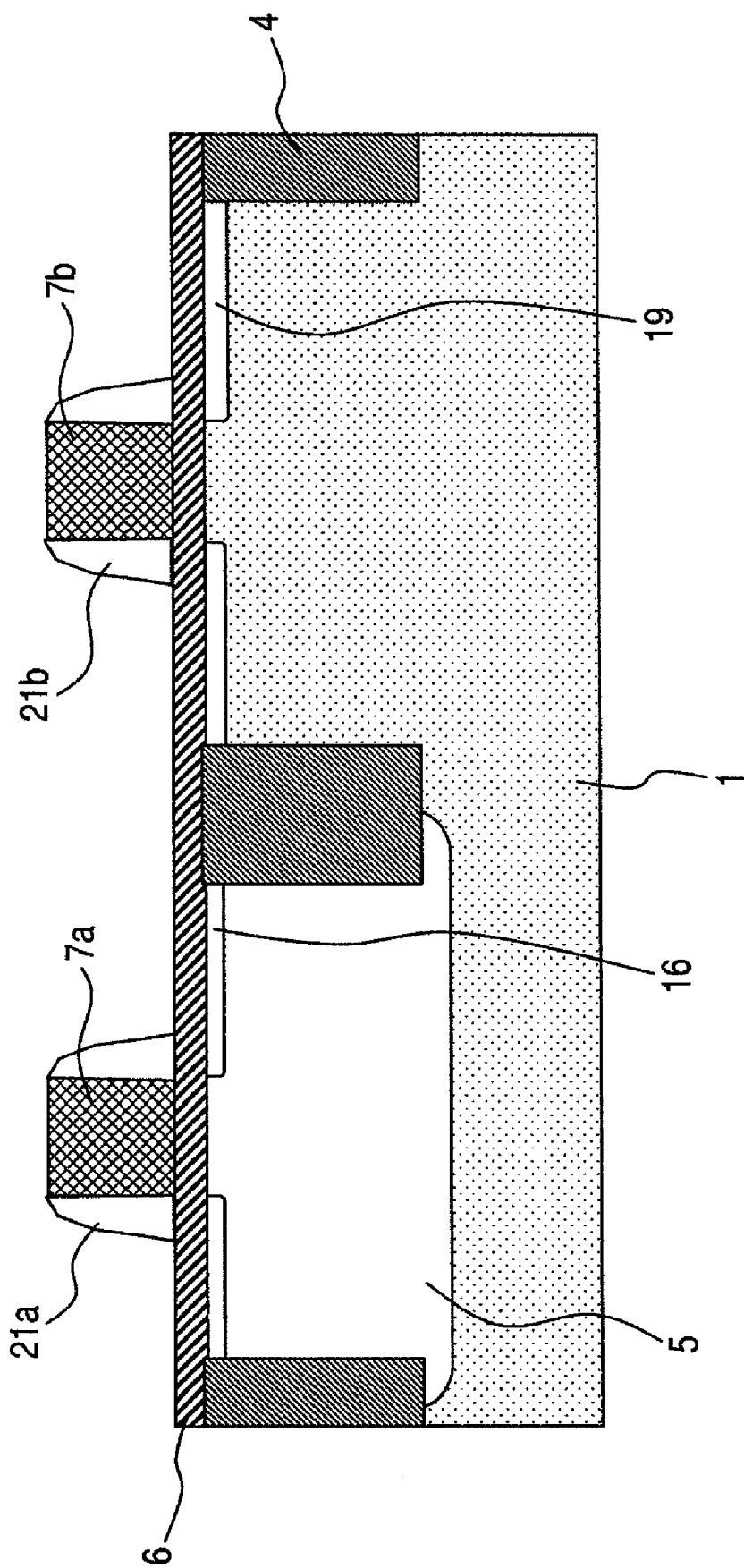
FIG. 22 is a device cross sectional flowchart (sidewall formation) showing the flow of the main part of the method for manufacturing a semiconductor device of one embodiment of the present application.
Figure 23:
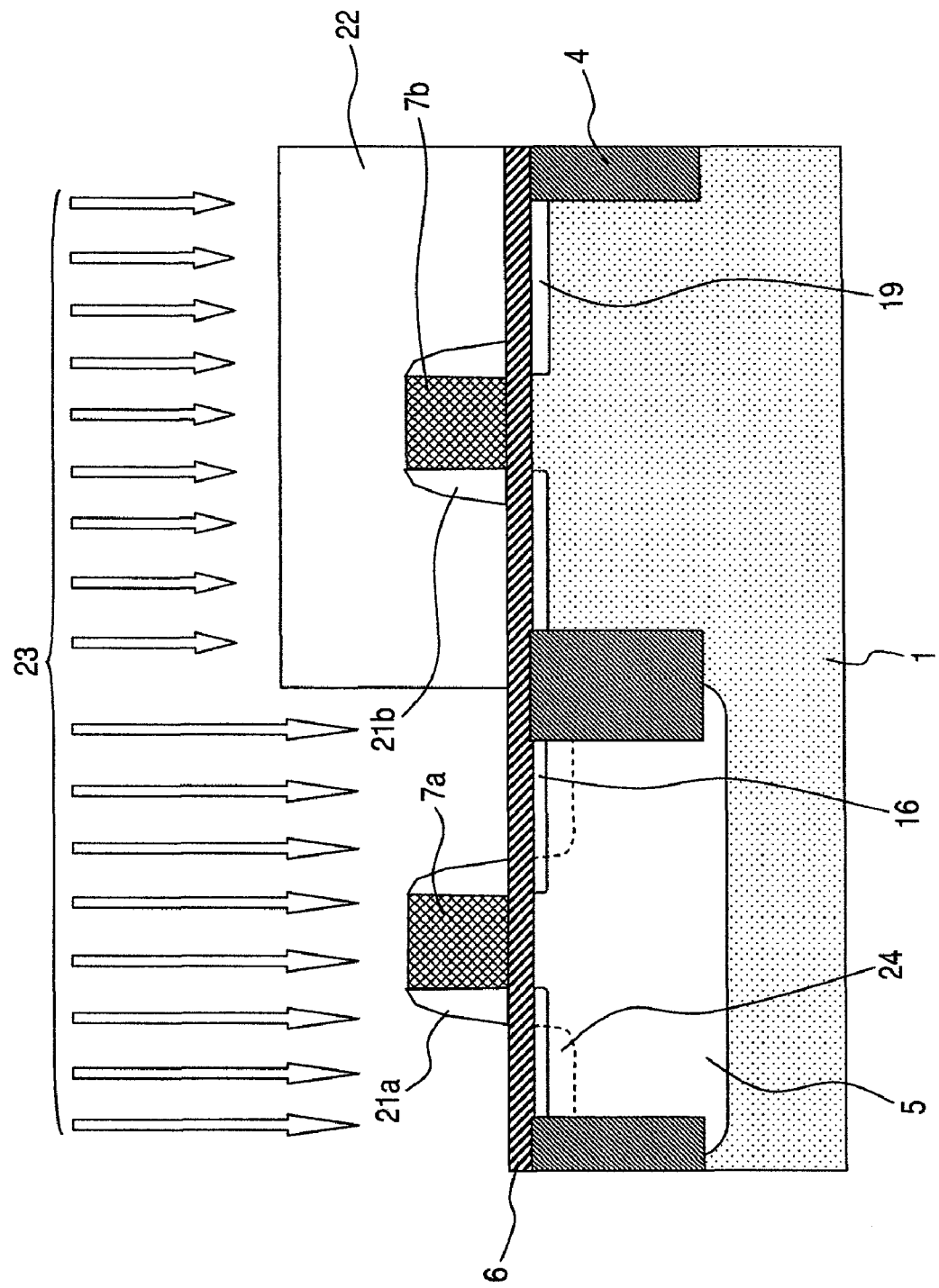
FIG. 23 is a device cross sectional flowchart (introduction of high-concentration P type impurities into the source/drain region of a P channel MISFET) showing the flow of the main part of the method for manufacturing a semiconductor device of one embodiment of the present application.
Figure 24:
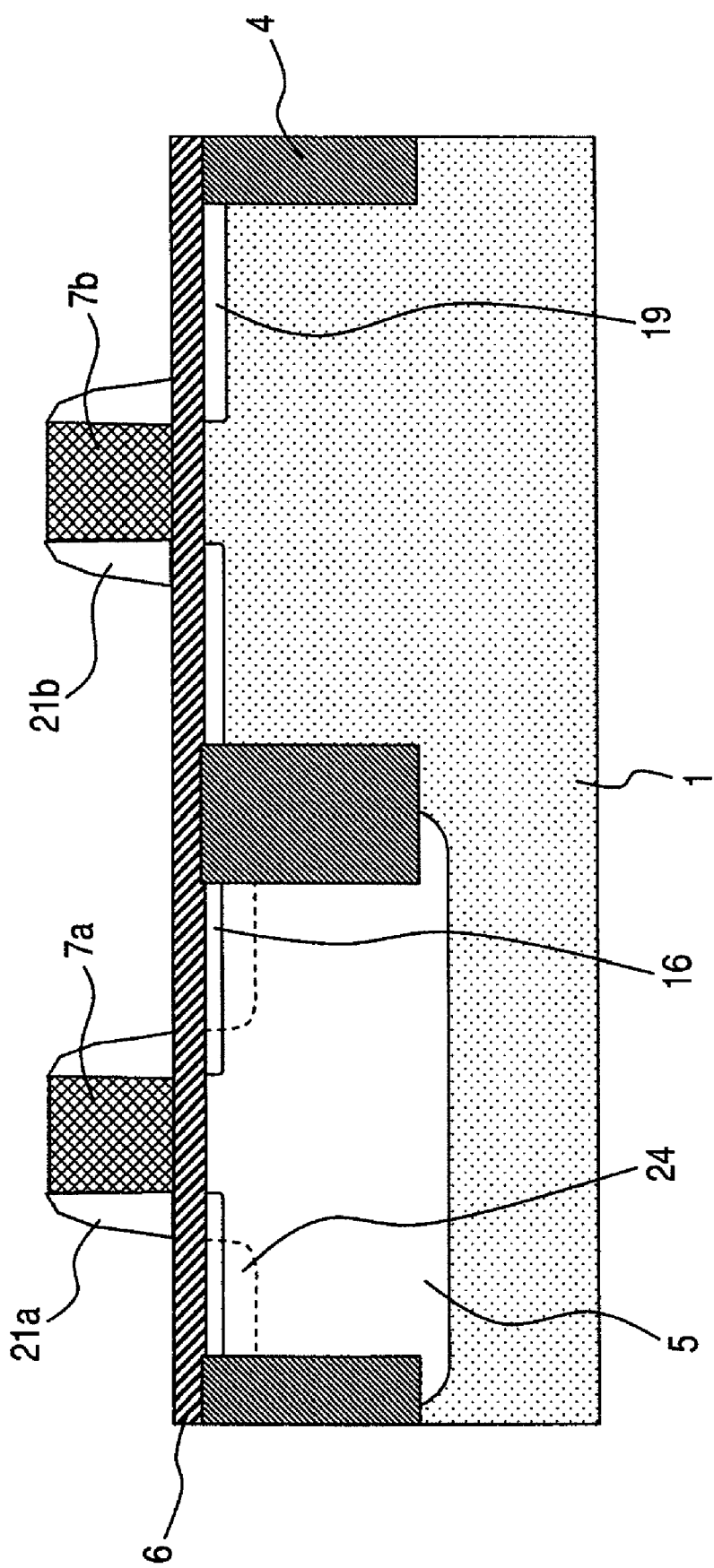
FIG. 24 is a device cross sectional flowchart (removal of the resist film pattern for introduction of high-concentration P type impurities into the source/drain region of a P channel MISFET) showing the flow of the main part of the method for manufacturing a semiconductor device of one embodiment of the present application.
Figure 25:
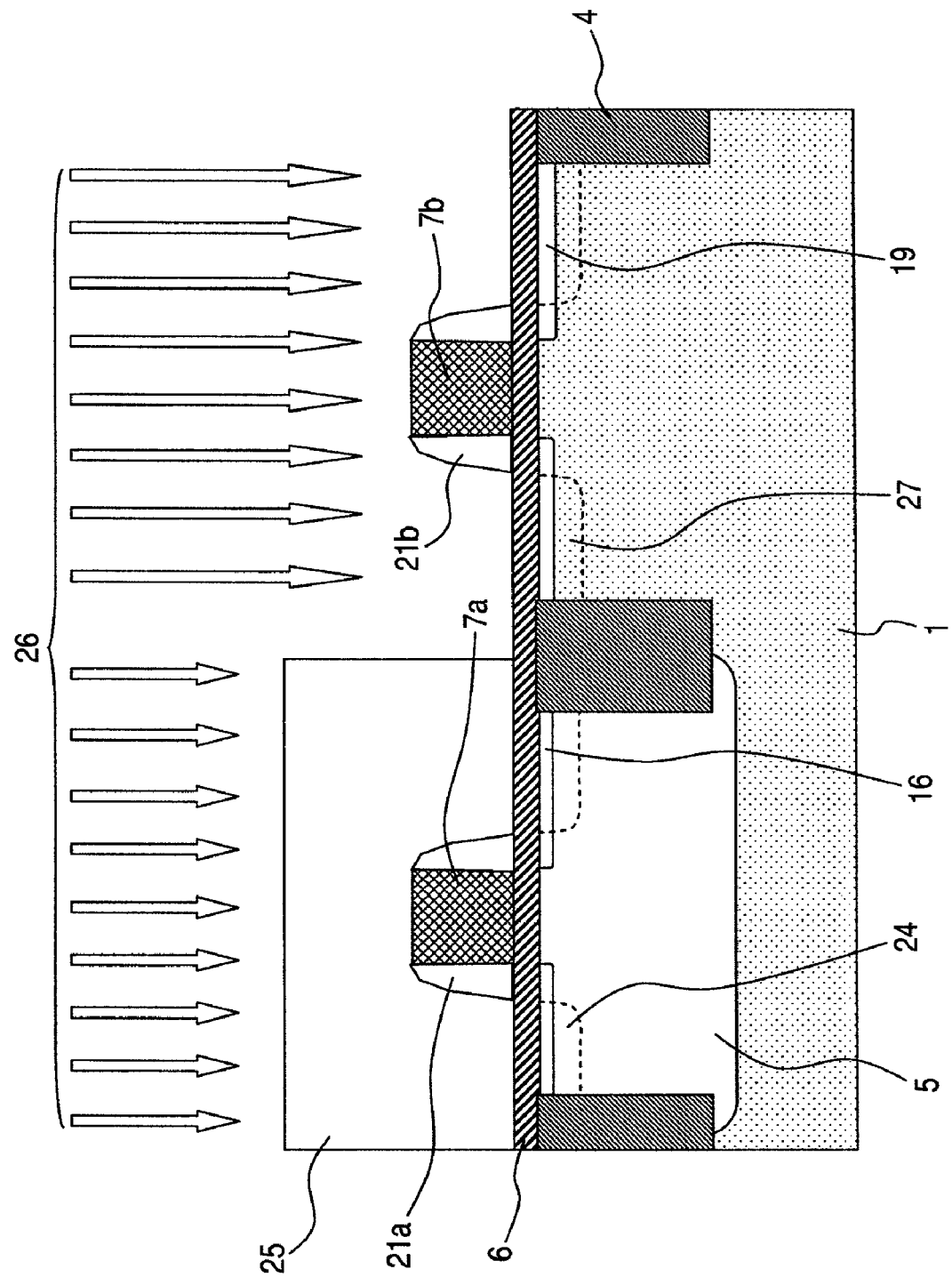
FIG. 25 is a device cross sectional flowchart (introduction of high-concentration N type impurities into the source/drain region of an N channel MISFET) showing the flow of the main part of the method for manufacturing a semiconductor device of one embodiment of the present application.
Figure 26:
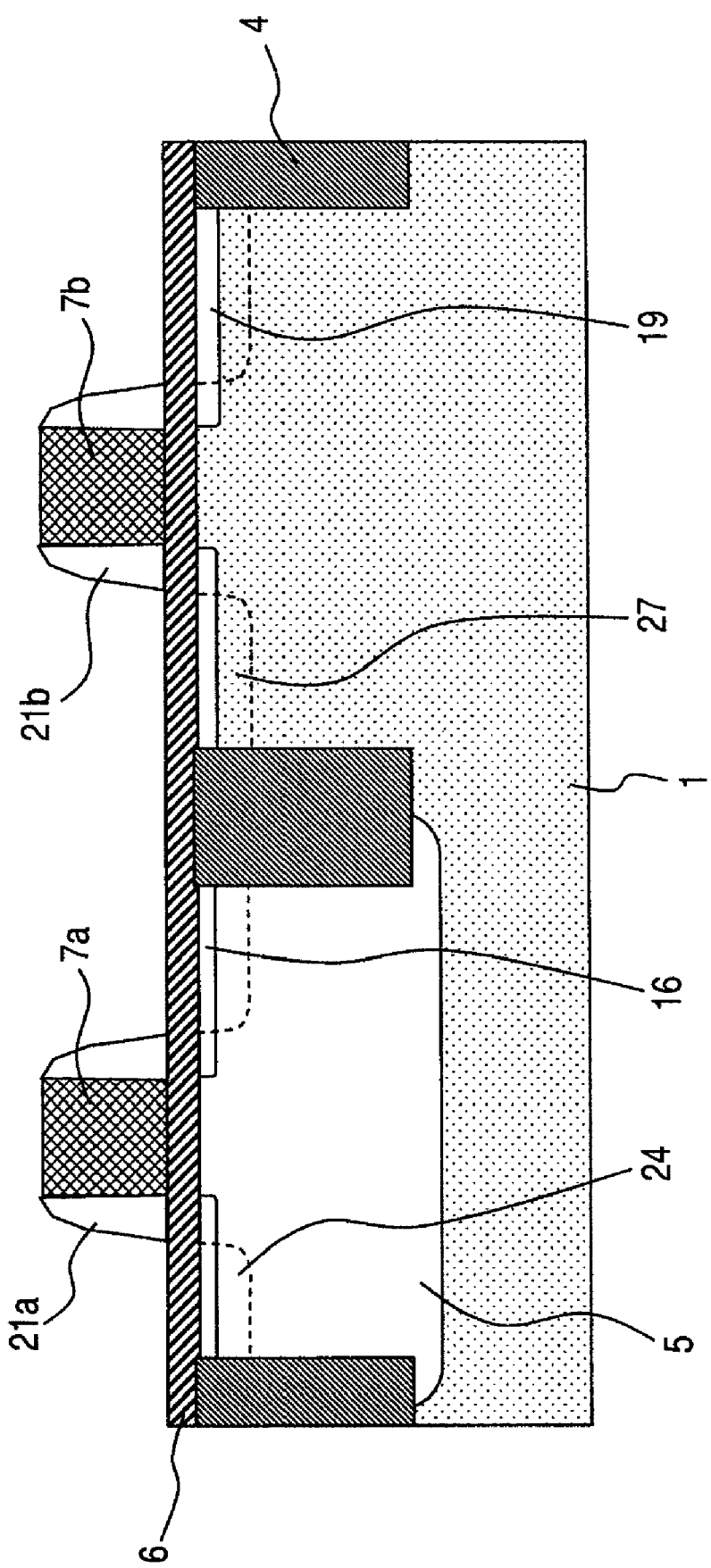
FIG. 26 is a device cross sectional flowchart (removal of the resist film pattern for introduction of high-concentration N type impurities into the source/drain region of an N channel MISFET) showing the flow of the main part of the method for manufacturing a semiconductor device of one embodiment of the present application.

FIG. 6 is a process block flowchart showing the main part of the method for manufacturing a semiconductor device of one embodiment of the present application. FIG. 7 is a device cross sectional flowchart (N wafer formation) showing the flow of the main part of the method for manufacturing a semiconductor device of one embodiment of the present application. FIG. 8 is a device cross sectional flowchart (gate oxidation) showing the flow of the main part of the method for manufacturing a semiconductor device of one embodiment of the present application. FIG. 9 is a device cross sectional flowchart (polysilicon film deposition) showing the flow of the main part of the method for manufacturing a semiconductor device of one embodiment of the present application. FIG. 10 is a device cross sectional flowchart (introduction of high-concentration P type impurities into the polysilicon film) showing the flow of the main part of the method for manufacturing a semiconductor device of one embodiment of the present application. FIG. 11 is a device cross sectional flowchart (removal of the resist film pattern for introduction of P type impurities into the polysilicon film) showing the flow of the main part of the method for manufacturing a semiconductor device of one embodiment of the present application. FIG. 12 is a device cross sectional flowchart (introduction of high-concentration N type impurities into the polysilicon film) showing the flow of the main part of the method for manufacturing a semiconductor device of one embodiment of the present application. FIG. 13 is a device cross sectional flowchart (removal of the resist film pattern for introduction of N type impurities into the polysilicon film) showing the flow of the main part of the method for manufacturing a semiconductor device of one embodiment of the present application. FIG. 14 is a device cross sectional flowchart (resist film pattern formation for patterning of the polysilicon film) showing the flow of the main part of the method for manufacturing a semiconductor device of one embodiment of the present application. FIG. 15 is a device cross sectional flowchart (patterning of gate electrode) showing the flow of the main part of the method for manufacturing a semiconductor device of one embodiment of the present application. FIG. 16 is a device cross sectional flowchart (resist removal for patterning of gate electrode) showing the flow of the main part of the method for manufacturing a semiconductor device of one embodiment of the present application. FIG. 17 is a device cross sectional flowchart (introduction of P type impurities into the source/drain extension of a P channel MISFET) showing the flow of the main part of the method for manufacturing a semiconductor device of one embodiment of the present application. FIG. 18 is a device cross sectional flowchart (removal of the resist film pattern for introduction of P type impurities into the source/drain extension of a P channel MISFET) showing the flow of the main part of the method for manufacturing a semiconductor device of one embodiment of the present application. FIG. 19 is a device cross sectional flowchart (introduction of N type impurities into the source/drain extension of an N channel MISFET) showing the flow of the main part of the method for manufacturing a semiconductor device of one embodiment of the present application. FIG. 20 is a device cross sectional flowchart (removal of the resist film pattern for introduction of N type impurities into the source/drain extension of an N channel MISFET) showing the flow of the main part of the method for manufacturing a semiconductor device of one embodiment of the present application. FIG. 21 is a device cross sectional flowchart (insulating film deposition for sidewall formation) showing the flow of the main part of the method for manufacturing a semiconductor device of one embodiment of the present application. FIG. 22 is a device cross sectional flowchart (sidewall formation) showing the flow of the main part of the method for manufacturing a semiconductor device of one embodiment of the present application. FIG. 23 is a device cross sectional flowchart (introduction of high-concentration P type impurities into the source/drain region of a P channel MISFET) showing the flow of the main part of the method for manufacturing a semiconductor device of one embodiment of the present application. FIG. 24 is a device cross sectional flowchart (removal of the resist film pattern for introduction of high-concentration P type impurities into the source/drain region of a P channel MISFET) showing the flow of the main part of the method for manufacturing a semiconductor device of one embodiment of the present application. FIG. 25 is a device cross sectional flowchart (introduction of high-concentration N type impurities into the source/drain region of an N channel MISFET) showing the flow of the main part of the method for manufacturing a semiconductor device of one embodiment of the present application. FIG. 26 is a device cross sectional flowchart (removal of the resist film pattern for introduction of high-concentration N type impurities into the source/drain region of an N channel MISFET) showing the flow of the main part of the method for manufacturing a semiconductor device of one embodiment of the present application. With reference to these accompanying drawings, a description will be given to one example of the device cross sectional process flow of the method for manufacturing a semiconductor integrated circuit device of one embodiment of the present application.

First, for example, a 300-dia P type silicon single crystal wafer 1 is prepared (the wafer may have a size of 200 in diameter, 450 in diameter, or the like. Further, the impurity type may be N type, if required. Furthermore, an epitaxial type wafer, a SOI wafer, or other insulation wafers are also acceptable). Then, as shown in FIG. 7, in the surface region of the device side 1a (the opposite side surface is the back side 1b) of the wafer 1, a STI (SHALLOW TRENCH ISOLATION) region 4 is formed. Herein, the STI region 4 has a depth of, for example, about 300 nm, and a width of, for example, about 70 nm.

Subsequently, under the device side 1a corresponding to a P channel MISFET formation region 2 of the P channel MISFET formation region 2 and the N channel MISFET formation region 3, an N type well region 5 is formed (N well formation step 151 of FIG. 6).

Then, as shown in FIG. 8, over the surface of the device side 1a of the wafer 1, a silicon oxide film 6 or a silicon oxynitride film with a thickness of, for example, about 7 nm is formed by thermal oxidation or the like (gate insulating film formation step 152 of FIG. 6). Thereover, as shown in FIG. 9, a non-doped polysilicon film 7 with a thickness of, for example, about 150 nm is formed with a CVD method (polysilicon film formation step 153 of FIG. 6).

Then, a resist film 8 is coated over the entire surface of the device side 1a of the wafer 1, and is formed into a resist film pattern 8 for doping P type impurities into the polysilicon film 7 with common lithography. The resist film 8 (as well as the following resists) is, for example, a chemical amplification type positive type resist (e.g., polyhydroxy styrene type).

Subsequently, as shown in FIG. 10, with the N channel MISFET formation region 3 being covered with the resist film 8 (resist film pattern), a P type impurity ion implantation treatment 9 (e.g., boron ions, dose of about $2\times10^{15}$ ions/cm$^2$, acceleration energy of about 10 keV) is carried out on the entire surface (P type impurity doping step 154 to the polysilicon film of FIG. 6; high-concentration ion implantation treatment A). Thereafter, as shown in FIG. 11, the unnecessary resist film pattern 8 is removed by any resist removal process described in Section 2 (resist removal step 155 of FIG. 6).

Then, a resist film 11 is coated over the entire surface of the device side 1a of the wafer 1, and is formed into a resist film pattern 11 for doping N type impurities into the polysilicon film 7 with common lithography. Subsequently, as shown in FIG. 12, with the P channel MISFET formation region 2 being covered with the resist film 11 (resist film pattern), an N type impurity ion implantation treatment 12 (e.g., phosphorus ions, dose of about $6\times10^{15}$ ions/cm$^2$, acceleration energy of about 20 keV) is carried out on the entire surface (N type impurity doping step 156 to the polysilicon film of FIG. 6; high-concentration ion implantation treatment B). Thereafter, as shown in FIG. 13, the unnecessary resist film pattern 11 is removed by any resist removal process described in Section 2 (resist removal step 157 of FIG. 6).

Then, over the entire surface of the device side 1a of the wafer 1, a resist film is coated, and is formed into resist film patterns 13a and 13b for patterning of gate electrodes with common lithography as shown in FIG. 14 (resist pattern formation step 158 of FIG. 6). Subsequently, with the resist film patterns 13a and 13b for patterning of gate electrodes being present, dry etching of the polysilicon film 7 is carried out. As a result, gate electrodes 7a and 7b with a width of about 90 nm are formed (gate electrode etching step 161 of FIG. 6). Dry etching of the polysilicon film 7 can be carried out by using a mixed gas of, for example, HBr, $Cl_2$, or $O_2$.

Subsequently, as shown in FIG. 16, the unnecessary resist film patterns 13a and 13b is removed by any resist removal process described in Section 2 (resist removal step 162 of FIG. 6).

Then, over the entire surface of the device side 1a of the wafer 1, a resist film 14 is coated, and, with common lithography, is formed into the resist film pattern 14 for doping of P type impurities into the portion to be a P type source/drain extension region 16 (P type LDD region) of the surface 1a of the N type well region 5 of the semiconductor substrate 1. Subsequently, as shown in FIG. 17, with the N channel MISFET formation region 3 being covered with the resist film 14 (resist film pattern), a P type impurity ion implantation treatment 15 (e.g., $BF_2$+, an implantation energy of about 2.5 keV, dose of $3\times10^{14}$ ions/$cm^{-2}$,) is carried out on the entire surface (P type SD impurity doping step 163 of FIG. 6). Thereafter, as shown in FIG. 18, the unnecessary resist film pattern 11 is removed, if required, by any resist removal process described in Section 2, or a common resist removal process (resist removal step 164 of FIG. 6).

Then, over the entire surface of the device side 1a of the wafer 1, a resist film 17 is coated, and is formed into a resist film pattern 17 for doping N type impurities into the portion to be an N type source/drain extension region 19 (N type LDD region) of the surface 1a of the semiconductor substrate 1. Subsequently, as shown in FIG. 19, with the P channel MISFET formation region 2 being covered with the resist film 17 (resist film pattern), an N type impurity ion implantation treatment 18 (e.g., As+, an implantation energy of about 3.5 keV, dose of $1\times10^{15}$ ions/$cm^{-2}$) is carried out on the entire surface (N type SD impurity doping step 165 of FIG. 6; high-concentration ion implantation treatment C). Thereafter, as shown in FIG. 20, the unnecessary resist film pattern 17 is removed by any resist removal process described in Section 2 (resist removal step 166 of FIG. 6).

Then, as shown in FIG. 21, an insulating film 21 to be a sidewall spacer (e.g., including an ozone TEOS film with a thickness of about 10 nm as a lower layer and a silicon nitride film with a thickness of about 45 nm as an upper layer) is formed over the entire surface of the device side 1a of the wafer 1 with a CVD method (insulating film formation over entire surface step 167 of FIG. 6). Then, as shown in FIG. 22, etching back is performed by anisotropic dry etching to form sidewalls 21a and 21b (sidewall formation step 167 of FIG. 6).

Then, over the entire surface of the device side 1a of the wafer 1, a resist film 22 is coated, and is formed into a resist film pattern 22 for doping P type impurities into the portion to be a high-concentration P type source/drain region 24 of the surface 1a of the N type well region 5 of the semiconductor substrate 1. Subsequently, as shown in FIG. 23, with the N channel MISFET formation region 3 being covered with the resist film 22 (resist film pattern), a P type impurity ion implantation treatment 23 (e.g., B+, an implantation energy of about 2 keV, dose of $4\times10^{15}$ ions/$cm^{-2}$) is carried out on the entire surface (P+ type SD impurity doping step 169 of FIG. 6; high-concentration ion implantation treatment D). Thereafter, as shown in FIG. 24, the unnecessary resist film pattern 22 is removed, if required, by any resist removal process described in Section 2, or a common resist removal process (resist removal step 171 of FIG. 6).

Then, over the entire surface of the device side 1a of the wafer 1, a resist film 25 is coated, and is formed into a resist film pattern 25 for doping N type impurities into the portion to be a high-concentration N type source/drain region 27 of the surface 1a of the semiconductor substrate 1. Subsequently, as shown in FIG. 25, with the P channel MISFET formation region 2 being covered with the resist film 25 (resist film pattern), an N type impurity ion implantation treatment 26 (e.g., As+, an implantation energy of about 20 keV, dose of $4\times10^{14}$ ions/$cm^{-2}$, and subsequently, P+, an implantation energy of about 10 keV, dose of $5\times10^{14}$ ions/$cm^{-2}$, thus, the treatment is performed in two stages) is carried out on the entire surface (N+ type SD impurity doping step 172 of FIG. 6; high-concentration ion implantation treatment E). Thereafter, as shown in FIG. 26, the unnecessary resist film pattern 25 is removed by any resist removal process described in Section 2 (resist removal step 173 of FIG. 6).

Thereafter, the silicon oxide film over the source/drain is removed in a self-aligned manner, thereby to convert the surfaces of source/drain, and the surfaces of the gate electrodes 7a and 7b into silicide (e.g., nickel silicide). Thereover, a liner silicon nitride film is formed. Subsequently, a premetal insulating film is formed. A contact hole is made therein, and a tungsten plug is embedded therein. Thereafter, a copper type or other type damascene wiring structure or aluminum type or other type common wiring structure is formed in, for example, about 3 layers to 10 layers. Thereafter, as the uppermost layer, an aluminum type pad layer is formed. Thereover, a final passivation film is formed which includes, for example, an inorganic film including a silicon nitride film as the lower layer, and an organic film including a polyimide type film as the upper layer. Thereafter, in the final passivation film, a pad opening is formed. Up to this point, the wafer step is assumed to be nearly completed.

4. Summary

Up to this point, the present invention made by the present inventors was specifically described based on embodiments. However, the present invention is not limited thereto. It is naturally understood that various changes may be made within the scope not departing from the gist thereof.

For example, herein, the silicon type semiconductor was specifically described. However, the present application is not limited thereto. It is naturally understood that the present application is also applicable to integrated circuits using GaAs type and other semiconductor substrates, single units, and the like. Further, in the embodiments, removal of the resist film modified by high-concentration ion implantation was specifically described. However, the present application is not limited thereto. It is naturally understood that the present application is also similarly applicable to removal of the resist film exposed to an atmosphere affected by plasma etching, or other high-energy ions, or the like. Further, the pressures such as treatment pressures exemplified in the embodiments are the optimum examples for the used devices and gases, and the state of the target resist, and the like (individual various conditions). These vary in various ways depending upon the individual various conditions. Therefore, it is naturally understood that the present application is not limited to the exemplified pressures, and other extrinsic process conditions.

What is claimed is:

1. A method for manufacturing a semiconductor integrated circuit device, comprising the steps of:
   (a) forming a resist film pattern over a first main surface of a wafer;
   (b) performing a high-concentration ion implantation treatment on the first main surface side of the wafer with the resist film pattern being present;
   (c) after the step (b), performing a baking treatment on the resist film pattern under atmospheric pressure, and within the wafer temperature range of 265 degrees centigrade or more and less than 350 degrees centigrade;
   (d) after the step (c), performing a first plasma ashing treatment on the first main surface of the wafer under an oxygen gas atmosphere, and within the wafer temperature range; and
   (e) after the step (d), applying a higher RF power than that with the first plasma ashing treatment, and performing a second plasma ashing treatment on the first main surface of the wafer under an oxygen gas atmosphere and within the wafer temperature range.

2. The method for manufacturing a semiconductor integrated circuit device according to claim 1, wherein the lower limit of the wafer temperature range is 270 degrees centigrade.

3. The method for manufacturing a semiconductor integrated circuit device according to claim 1, wherein the lower limit of the wafer temperature range is 280 degrees centigrade.

4. The method for manufacturing a semiconductor integrated circuit device according to claim 1, wherein the addition ratio of the oxygen gas atmosphere of the steps (d) and (e) is less than 2 vol %.

5. The method for manufacturing a semiconductor integrated circuit device according to claim 1, wherein the addition ratio of the oxygen gas atmosphere of the steps (d) and (e) is less than 1 vol %.

6. The method for manufacturing a semiconductor integrated circuit device according to claim 1, wherein the baking treatment and the first plasma ashing treatment are performed over the same wafer stage in the same treatment chamber.

7. The method for manufacturing a semiconductor integrated circuit device according to claim 1, wherein the first plasma ashing treatment and the second plasma ashing treatment are performed over the same wafer stage in the same treatment chamber.

8. The method for manufacturing a semiconductor integrated circuit device according to claim 1, wherein the steps (c) to (e) are performed over the same wafer stage in the same treatment chamber.

9. The method for manufacturing a semiconductor integrated circuit device according to claim 1, wherein the steps (c) to (e) are performed over the same wafer stage set at a roughly constant temperature in the same treatment chamber.

10. A method for manufacturing a semiconductor integrated circuit device, comprising the steps of:
    (a) forming a resist film pattern over a first main surface of a wafer;
    (b) performing a high-concentration ion implantation treatment on the first main surface side of the wafer with the resist film pattern being present;
    (c) after the step (b), performing a first plasma ashing treatment on the first main surface of the wafer under an atmosphere containing an oxygen gas as a main component;
    (d) after the step (c), holding the wafer in a state such that there is substantially no plasma atmosphere in the vicinity of the first main surface of the wafer; and
    (e) after the step (d), performing a second plasma ashing treatment on the first main surface of the wafer under an atmosphere containing an oxygen gas as a main component under roughly the same pressure as that in the step (c).

11. The method for manufacturing a semiconductor integrated circuit device according to claim 10, further comprising a step of:
    (f) after the step (e), further performing the steps (d) and (e) only a prescribed number of repetition times.

12. The method for manufacturing a semiconductor integrated circuit device according to claim 10, further comprising a step of:
    (g) after the step (e), applying a higher RF power than those with the first and second plasma ashing treatments, and performing a third plasma ashing treatment on the first main surface of the wafer under an atmosphere containing an oxygen gas as a main component, and within the wafer temperature range.

13. The method for manufacturing a semiconductor integrated circuit device according to claim 11, further comprising a step of:
    (g) after the step (f), applying a higher RF power than those with the first and second plasma ashing treatments, and performing a third plasma ashing treatment on the first main surface of the wafer under an atmosphere containing an oxygen gas as a main component, and within the wafer temperature range.

14. The method for manufacturing a semiconductor integrated circuit device according to claim 10, further comprising a step of:
    (h) between the steps (b) and (c), performing a baking treatment on the resist film pattern under atmospheric pressure.

15. The method for manufacturing a semiconductor integrated circuit device according to claim 10, wherein the steps (c) to (e) are performed over the same wafer stage in the same treatment chamber.

16. The method for manufacturing a semiconductor integrated circuit device according to claim 10, wherein the steps (c) to (e) are performed without substantially changing the atmosphere.

17. The method for manufacturing a semiconductor integrated circuit device according to claim 10, wherein the steps (c) to (e) are performed over the same wafer stage set at a roughly constant temperature in the same treatment chamber.

18. The method for manufacturing a semiconductor integrated circuit device according to claim 10, wherein the steps (c) to (f) are performed over the same wafer stage in the same treatment chamber.

19. The method for manufacturing a semiconductor integrated circuit device according to claim 10, wherein the steps (c) to (g) are performed over the same wafer stage in the same treatment chamber.

20. The method for manufacturing a semiconductor integrated circuit device according to claim 10, wherein the steps (c) to (h) are performed over the same wafer stage in the same treatment chamber.

* * * * *